United States Patent [19]
Tachibana et al.

[11] Patent Number: 6,154,513
[45] Date of Patent: *Nov. 28, 2000

[54] DATA RECEIVING APPARATUS AND METHOD OF DEINTERLEAVING DATA

[75] Inventors: Toshiyuki Tachibana, Ome; Satoshi Sato, Tokyo, both of Japan

[73] Assignee: Casio Computer Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/773,213

[22] Filed: Dec. 23, 1996

[30] Foreign Application Priority Data

Dec. 29, 1995 [JP] Japan .................................. 7-354309

[51] Int. Cl.⁷ .................................................. H04L 23/00
[52] U.S. Cl. ............................................ 375/377; 375/340
[58] Field of Search ..................................... 375/340, 286, 375/225, 358, 377, 324; 340/825.44

[56] References Cited

U.S. PATENT DOCUMENTS 5,063,533  11/1991  Erhart et al. ............................ 395/425
5,689,511  11/1997  Shimazaki et al. ..................... 370/545
5,862,189   1/1999  Huisken et al. ........................ 375/341

*Primary Examiner*—Chi H. Pham
*Assistant Examiner*—Jean B Corrielus
*Attorney, Agent, or Firm*—Frishauf, Holtz, Goodman, Langer & Chick, P.C.

[57] ABSTRACT

When a frame information (F1)C2 defining the frame type in a transmission protocol format is received in a pager, data of a following interleaving portion is received. A receiving buffer circuit converts the received data from serial data into parallel data in accordance with the frame type, and a deinterleaving circuit reproduces (deinterleaves) the converted parallel data.

20 Claims, 38 Drawing Sheets

FIG.3

| REGISTER | Rh | Rg | Rf | Re | Rd | Rc | Rb | Ra |
|---|---|---|---|---|---|---|---|---|
| | LATCH | | | | | | | |
| B7 | LhD7 | LhD6 | LhD5 | LhD4 | LhD3 | LhD2 | LhD1 | LhD0 |
| B6 | LgD7 | LgD6 | LgD5 | LgD4 | LgD3 | LgD2 | LgD1 | LgD0 |
| B5 | LfD7 | LfD6 | LfD5 | LfD4 | LfD3 | LfD2 | LfD1 | LfD0 |
| B4 | LeD7 | LeD6 | LeD5 | LeD4 | LeD3 | LeD2 | LeD1 | LeD0 |
| B3 | LdD7 | LdD6 | LdD5 | LdD4 | LdD3 | LdD2 | LdD1 | LdD0 |
| B2 | LcD7 | LcD6 | LcD5 | LcD4 | LcD3 | LcD2 | LcD1 | LcD0 |
| B1 | LbD7 | LbD6 | LbD5 | LbD4 | LbD3 | LbD2 | LbD1 | LbD0 |
| B0 | LaD7 | LaD6 | LaD5 | LaD4 | LaD3 | LaD2 | LaD1 | LaD0 |

FIG.4

| REGISTER | Rh | Rg | Rf | Re | Rd | Rc | Rb | Ra |
|---|---|---|---|---|---|---|---|---|
| | LATCH | | | | | | | |
| B7 | LhD7 | LhD6 | LhD5 | LhD4 | LhD3 | LhD2 | LhD1 | LhD0 |
| | W7a8 | W7a7 | W7a6 | W7a5 | W7a4 | W7a3 | W7a2 | W7a1 |
| B6 | LgD7 | LgD6 | LgD5 | LgD4 | LgD3 | LgD2 | LgD1 | LgD0 |
| | W6a8 | W6a7 | W6a6 | W6a5 | W6a4 | W6a3 | W6a2 | W6a1 |
| B5 | LfD7 | LfD6 | LfD5 | LfD4 | LfD3 | LfD2 | LfD1 | LfD0 |
| | W5a8 | W5a7 | W5a6 | W5a5 | W5a4 | W5a3 | W5a2 | W5a1 |
| B4 | LeD7 | LeD6 | LeD5 | LeD4 | LeD3 | LeD2 | LeD1 | LeD0 |
| | W4a8 | W4a7 | W4a6 | W4a5 | W4a4 | W4a3 | W4a2 | W4a1 |
| B3 | LdD7 | LdD6 | LdD5 | LdD4 | LdD3 | LdD2 | LdD1 | LdD0 |
| | W3a8 | W3a7 | W3a6 | W3a5 | W3a4 | W3a3 | W3a2 | W3a1 |
| B2 | LcD7 | LcD6 | LcD5 | LcD4 | LcD3 | LcD2 | LcD1 | LcD0 |
| | W2a8 | W2a7 | W2a6 | W2a5 | W2a4 | W2a3 | W2a2 | W2a1 |
| B1 | LbD7 | LbD6 | LbD5 | LbD4 | LbD3 | LbD2 | LbD1 | LbD0 |
| | W1a8 | W1a7 | W1a6 | W1a5 | W1a4 | W1a3 | W1a2 | W1a1 |
| B0 | LaD7 | LaD6 | LaD5 | LaD4 | LaD3 | LaD2 | LaD1 | LaD0 |
| | W0a8 | W0a7 | W0a6 | W0a5 | W0a4 | W0a3 | W0a2 | W0a1 |

FIG.5

| REGISTER | Rh | Rg | Rf | Re | Rd | Rc | Rb | Ra |
|---|---|---|---|---|---|---|---|---|
| | LATCH | | | | | | | |
| B7 | LhD7 | LhD6 | LhD5 | LhD4 | LhD3 | LhD2 | LhD1 | LhD0 |
| | W7c4 | W3c4 | W7c3 | W3c3 | W7c2 | W3c2 | W7c1 | W3c1 |
| B6 | LgD7 | LgD6 | LgD5 | LgD4 | LgD3 | LgD2 | LgD1 | LgD0 |
| | W7a4 | W3a4 | W7a3 | W3a3 | W7a2 | W3a2 | W7a1 | W3a1 |
| B5 | LfD7 | LfD6 | LfD5 | LfD4 | LfD3 | LfD2 | LfD1 | LfD0 |
| | W6c4 | W2c4 | W6c3 | W2c3 | W6c2 | W2c2 | W6c1 | W2c1 |
| B4 | LeD7 | LeD6 | LeD5 | LeD4 | LeD3 | LeD2 | LeD1 | LeD0 |
| | W6a4 | W2a4 | W6a3 | W2a3 | W6a2 | W2a2 | W6a1 | W2a1 |
| B3 | LdD7 | LdD6 | LdD5 | LdD4 | LdD3 | LdD2 | LdD1 | LdD0 |
| | W5c4 | W1c4 | W5c3 | W1c3 | W5c2 | W1c2 | W5c1 | W1c1 |
| B2 | LcD7 | LcD6 | LcD5 | LcD4 | LcD3 | LcD2 | LcD1 | LcD0 |
| | W5a4 | W1a4 | W5a3 | W1a3 | W5a2 | W1a2 | W5a1 | W1a1 |
| B1 | LbD7 | LbbD6 | LbD5 | LbD4 | LbD3 | LbD2 | LbD1 | LbD0 |
| | W4c4 | W0c4 | W4c3 | W0c3 | W4c2 | W0c2 | W4c1 | W0c1 |
| B0 | LaD7 | LaD6 | LaD5 | LaD4 | LaD3 | LaD2 | LaD1 | LaD0 |
| | W4a4 | W0a4 | W4a3 | W0a3 | W4a2 | W0a2 | W4a1 | W0a1 |

FIG.6

| REGISTER | Rh | Rg | Rf | Re | Rd | Rc | Rb | Ra |
|---|---|---|---|---|---|---|---|---|
| | LATCH | | | | | | | |
| B7 | | LhD7 | LhD6 | LhD5 | LhD4 | LhD3 | LhD2 | LhD1 | LhD0 |
| | | W7c8 | W3c8 | W7c7 | W3c7 | W7c6 | W3c6 | W7c5 | W3c5 |
| B6 | | LgD7 | LgD6 | LgD5 | LgD4 | LgD3 | LgD2 | LgD1 | LgD0 |
| | | W7a8 | W3a8 | W7a7 | W3a7 | W7a6 | W3a6 | W7a5 | W3a5 |
| B5 | | LfD7 | LfD6 | LfD5 | LfD4 | LfD3 | LfD2 | LfD1 | LfD0 |
| | | W6c8 | W2c8 | W6c7 | W2c7 | W6c6 | W2c6 | W6c5 | W2c5 |
| B4 | | LeD7 | LeD6 | LeD5 | LeD4 | LeD3 | LeD2 | LeD1 | LeD0 |
| | | W6a8 | W2a8 | W6a7 | W2a7 | W6a6 | W2a6 | W6a5 | W2a5 |
| B3 | | LdD7 | LdD6 | LdD5 | LdD4 | LdD3 | LdD2 | LdD1 | LdD0 |
| | | W5c8 | W1c8 | W5c7 | W1c7 | W5c6 | W1c6 | W5c5 | W1c5 |
| B2 | | LcD7 | LcD6 | LcD5 | LcD4 | LcD3 | LcD2 | LcD1 | LcD0 |
| | | W5a8 | W1a8 | W5a7 | W1a7 | W5a6 | W1a6 | W5a5 | W1a5 |
| B1 | | LbD7 | LbD6 | LbD5 | LbD4 | LbD3 | LbD2 | LbD1 | LbD0 |
| | | W4c8 | W0c8 | W4c7 | W0c7 | W4c6 | W0c6 | W4c5 | W0c5 |
| B0 | | LaD7 | LaD6 | LaD5 | LaD4 | LaD3 | LaD2 | LaD1 | LaD0 |
| | | W4a8 | W0a8 | W4a7 | W0a7 | W4a6 | W0a6 | W4a5 | W0a5 |

FIG.7

| REGISTER | Rh | Rf | Rf | Re | Rd | Rc | Rb | Ra |
|---|---|---|---|---|---|---|---|---|
| | LATCH | | | | | | | |
| B7 | LhD7 | LhD6 | LhD5 | LhD4 | LhD3 | LhD2 | LhD1 | LhD0 |
| | W7a4 | W7a3 | W7a2 | W7a1 | W7c4 | W7c3 | W7c2 | W7c1 |
| B6 | LgD7 | LgD6 | LgD5 | LgD4 | LgD3 | LgD2 | LgD1 | LgD0 |
| | W6a4 | W6a3 | W6a2 | W6a1 | W6c4 | W6c3 | W6c2 | W6c1 |
| B5 | LfD7 | LfD6 | LfD5 | LfD4 | LfD3 | LfD2 | LfD1 | LfD0 |
| | W5a4 | W5a3 | W5a2 | W5a1 | W5c4 | W5c3 | W5c2 | W5c1 |
| B4 | LeD7 | LeD6 | LeD5 | LeD4 | LeD3 | LeD2 | LeD1 | LeD0 |
| | W4a4 | W4a3 | W4a2 | W4a1 | W4c4 | W4c3 | W4c2 | W4c1 |
| B3 | LdD7 | LdD6 | LdD5 | LdD4 | LdD3 | LdD2 | LdD1 | LdD0 |
| | W3a4 | W3a3 | W3a2 | W3a1 | W3c4 | W3c3 | W3c2 | W3c1 |
| B2 | LcD7 | LcD6 | LcD5 | LcD4 | LcD3 | LcD2 | LcD1 | LcD0 |
| | W2a4 | W2a3 | W2a2 | W2a1 | W2c4 | W2c3 | W2c2 | W2c1 |
| B1 | LbD7 | LbD6 | LbD5 | LbD4 | LbD3 | LbD2 | LbD1 | LbD0 |
| | W1a4 | W1a3 | W1a2 | W1a1 | W1c4 | W1c3 | W1c2 | W1c1 |
| B0 | LaD7 | LaD6 | LaD5 | LaD4 | LaD3 | LaD2 | LaD1 | LaD0 |
| | W0a4 | W0a3 | W0a2 | W0a1 | W0c4 | W0c3 | W0c2 | W0c1 |

| MSB | LSB |
|---|---|

FIG.8

| REGISTER | Rh | Rg | Rf | Re | Rd | Rc | Rb | Ra |
|---|---|---|---|---|---|---|---|---|
| | LATCH | | | | | | | |
| B7 | LhD7 | LhD6 | LhD5 | LhD4 | LhD3 | LhD2 | LhD1 | LhD0 |
| | W7a8 | W7a7 | W7a6 | W7a5 | W7c8 | W7c7 | W7c6 | W7c5 |
| B6 | LgD7 | LgD6 | LgD5 | LgD4 | LgD3 | LgD2 | LgD1 | LgD0 |
| | W6a8 | W6a7 | W6a6 | W6a5 | W6c8 | W6c7 | W6c6 | W6c5 |
| B5 | LfD7 | LfD6 | LfD5 | LfD4 | LfD3 | LfD2 | LfD1 | LfD0 |
| | W5a8 | W5a7 | W5a6 | W5a5 | W5c8 | W5c7 | W5c6 | W5c5 |
| B4 | LeD7 | LeD6 | LeD5 | LeD4 | LeD3 | LeD2 | LeD1 | LeD0 |
| | W4a8 | W4a7 | W4a6 | W4a5 | W4c8 | W4c7 | W4c6 | W4c5 |
| B3 | LdD7 | LdD6 | LdD5 | LdD4 | LdD3 | LdD2 | LdD1 | LdD0 |
| | W3a8 | W3a7 | W3a6 | W3a5 | W3c8 | W3c7 | W3c6 | W3c5 |
| B2 | LcD7 | LcD6 | LcD5 | LcD4 | LcD3 | LcD2 | LcD1 | LcD0 |
| | W2a8 | W2a7 | W2a6 | W2a5 | W2c8 | W2c7 | W2c6 | W2c5 |
| B1 | LbD7 | LbD6 | LbD5 | LbD4 | LbD3 | LbD2 | LbD1 | LbD0 |
| | W1a8 | W1a7 | W1a6 | W1a5 | W1c8 | W1c7 | W1c6 | W1c5 |
| B0 | LaD7 | LaD6 | LaD5 | LaD4 | LaD3 | LaD2 | LaD1 | LaD0 |
| | W0a8 | W0a7 | W0a6 | W0a5 | W0c8 | W0c7 | W0c6 | W0c5 |

|← MSB →|← LSB →|

FIG.9

| REGISTER | Rh | Rg | Rf | Re | Rd | Rc | Rb | Ra |
|---|---|---|---|---|---|---|---|---|
| | LATCH | | | | | | | |
| B7 | LhD7 | LhD6 | LhD5 | LhD4 | LhD3 | LhD2 | LhD1 | LhD0 |
| | W7c2 | W3c2 | W7c1 | W3c1 | W7d2 | W3d2 | W7d1 | W3d1 |
| B6 | LgD7 | LgD6 | LgD5 | LgD4 | LgD3 | LgD2 | LgD1 | LgD0 |
| | W7a2 | W3a2 | W7a1 | W3a1 | W7b2 | W3b2 | W7b1 | W3b1 |
| B5 | LfD7 | LfD6 | LfD5 | LfD4 | LfD3 | LfD2 | LfD1 | LfD0 |
| | W6c2 | W2c2 | W6c1 | W2c1 | W6d2 | W2d2 | W6d1 | W2d1 |
| B4 | LeD7 | LeD6 | LeD5 | LeD4 | LeD3 | LeD2 | LeD1 | LeD0 |
| | W6a2 | W2a2 | W6a1 | W2a1 | W6b2 | W2b2 | W6b1 | W2b1 |
| B3 | LdD7 | LdD6 | LdD5 | LdD4 | LdD3 | LdD2 | LdD1 | LdD0 |
| | W5c2 | W1c2 | W5c1 | W1c1 | W5d2 | W1d2 | W5d1 | W1d1 |
| B2 | LcD7 | LcD6 | LcD5 | LcD4 | LcD3 | LcD2 | LcD1 | LcD0 |
| | W5a2 | W1a2 | W5a1 | W1a1 | W5b2 | W1b2 | W5b1 | W1b1 |
| B1 | LbD7 | LbD6 | LbD5 | LbD4 | LbD3 | LbD2 | LbD1 | LbD0 |
| | W4c2 | W0c2 | W4c1 | W0c1 | W4d2 | W0d2 | W4d1 | W0d1 |
| B0 | LaD7 | LaD6 | LaD5 | LaD4 | LaD3 | LaD2 | LaD1 | LaD0 |
| | W4a2 | W0a2 | W4a1 | W0a1 | W4b2 | W0b2 | W4b1 | W0b1 |

|←——— MSB ———→|←——— LSB ———→|

FIG.10

| REGISTER | Rh | Rg | Rf | Re | Rd | Rc | Rb | Ra |
|---|---|---|---|---|---|---|---|---|
| | LATCH | | | | | | | |
| B7 | LhD7 | LhD6 | LhD5 | LhD4 | LhD3 | LhD2 | LhD1 | LhD0 |
| | W7c4 | W3c4 | W7c3 | W3c3 | W7d4 | W3d4 | W7d3 | W3d3 |
| B6 | LgD7 | LgD6 | LgD5 | LgD4 | LgD3 | LgD2 | LgD1 | LgD0 |
| | W7a4 | W3a4 | W7a3 | W3a3 | W7b4 | W3b4 | W7b3 | W3b3 |
| B5 | LfD7 | LfD6 | LfD5 | LfD4 | LfD3 | LfD2 | LfD1 | LfD0 |
| | W6c4 | W2c4 | W6c3 | W2c3 | W6d4 | W2d4 | W6d3 | W2d3 |
| B4 | LeD7 | LeD6 | LeD5 | LeD4 | LeD3 | LeD2 | LeD1 | LeD0 |
| | W6a4 | W2a4 | W6a3 | W2a3 | W6b4 | W2b4 | W6b3 | W2b3 |
| B3 | LdD7 | LdD6 | LdD5 | LdD4 | LdD3 | LdD2 | LdD1 | LdD0 |
| | W5c4 | W1c4 | W5c3 | W1c3 | W5d4 | W1d4 | W5d3 | W1d3 |
| B2 | LcD7 | LcD6 | LcD5 | LcD4 | LcD3 | LcD2 | LcD1 | LcD0 |
| | W5a4 | W1a4 | W5a3 | W1a3 | W5b4 | W1b4 | W5b3 | W1b3 |
| B1 | LbD7 | LbD6 | LbD5 | LbD4 | LbD3 | LbD2 | LbD1 | LbD0 |
| | W4c4 | W0c4 | W4c3 | W0C3 | W4d4 | W0d4 | W4d3 | W0d3 |
| B0 | LaD7 | LaD6 | LaD5 | LaD4 | LaD3 | LaD2 | LaD1 | LaD0 |
| | W4a4 | W0a4 | W4a3 | W0a3 | W4b4 | W0b4 | W4b3 | W0b3 |

MSB | LSB

FIG.11

| REGISTER | Rh | Rg | Rf | Re | Rd | Rc | Rb | Ra |
|---|---|---|---|---|---|---|---|---|
| | LATCH | | | | | | | |
| B7 | LhD7 | LhD6 | LhD5 | LhD4 | LhD3 | LhD2 | LhD1 | LhD0 |
| | W7c6 | W3c6 | W7c5 | W3c5 | W7d6 | W3d6 | W7d5 | W3d5 |
| B6 | LgD7 | LgD6 | LgD5 | LgD4 | LgD3 | LgD2 | LgD1 | LgD0 |
| | W7a6 | W3a6 | W7a5 | W3a5 | W7b6 | W3b6 | W7b5 | W3b5 |
| B5 | LfD7 | LfD6 | LfD5 | LfD4 | LfD3 | LfD2 | LfD1 | LfD0 |
| | W6c6 | W2c6 | W6c5 | W2c5 | W6d6 | W2d6 | W6d5 | W2d5 |
| B4 | LeD7 | LeD6 | LeD5 | LeD4 | LeD3 | LeD2 | LeD1 | LeD0 |
| | W6a6 | W2a6 | W6a5 | W2a5 | W6b6 | W2b6 | W6b5 | W2b5 |
| B3 | LdD7 | LdD6 | LdD5 | LdD4 | LdD3 | LdD2 | LdD1 | LdD0 |
| | W5c6 | W1c6 | W5c5 | W1c5 | W5d6 | W1d6 | W5d5 | W1d5 |
| B2 | LcD7 | LcD6 | LcD5 | LcD4 | LcD3 | LcD2 | LcD1 | LcD0 |
| | W5a6 | W1a6 | W5a5 | W1a5 | W5b6 | W1b6 | W5b5 | W1b5 |
| B1 | LbD7 | LbD6 | LbD5 | LbD4 | LbD3 | LbD2 | LbD1 | LbD0 |
| | W4c6 | W0c6 | W4c5 | W0c5 | W4d6 | W0d6 | W4d5 | W0d5 |
| B0 | LaD7 | LaD6 | LaD5 | LaD4 | LaD3 | LaD2 | LaD1 | LaD0 |
| | W4a6 | W0a6 | W4a5 | W0a5 | W4b6 | W0b6 | W4b5 | W0b5 |

| MSB | LSB |

FIG.12

| REGISTER | Rh | Rf | Rf | Re | Rd | Rc | Rb | Ra |
|---|---|---|---|---|---|---|---|---|
| | LATCH | | | | | | | |
| B7 | LhD7 | LhD6 | LhD5 | LhD4 | LhD3 | LhD2 | LhD1 | LhD0 |
| | W7c8 | W3c8 | W7c7 | W3c7 | W7d8 | W3d8 | W7d7 | W3d7 |
| B6 | LgD7 | LgD6 | LgD5 | LgD4 | LgD3 | LgD2 | LgD1 | LgD0 |
| | W7a8 | W3a8 | W7a7 | W3a7 | W7b8 | W3b8 | W7b7 | W3b7 |
| B5 | LfD7 | LfD6 | LfD5 | LfD4 | LfD3 | LfD2 | LfD1 | LfD0 |
| | W6c8 | W2c8 | W6c7 | W2c7 | W6d8 | W2d8 | W6d7 | W2d7 |
| B4 | LeD7 | LeD6 | LeD5 | LeD4 | LeD3 | LeD2 | LeD1 | LeD0 |
| | W6a8 | W2a8 | W6a7 | W2a7 | W6b8 | W2b8 | W6b7 | W2b7 |
| B3 | LdD7 | LdD6 | LdD5 | LdD4 | LdD3 | LdD2 | LdD1 | LdD0 |
| | W5c8 | W1c8 | W5c7 | W1c7 | W5d8 | W1d8 | W5d7 | W1d7 |
| B2 | LcD7 | LcD6 | LcD5 | LcD4 | LcD3 | LcD2 | LcD6 | LcD6 |
| | W5a8 | W1a8 | W5a7 | W1a7 | W5b8 | W1b8 | W5b7 | W1b7 |
| B1 | LbD7 | LbD6 | LbD5 | LbD4 | LbD3 | LbD2 | LbD6 | LbD6 |
| | W4c8 | W0c8 | W4c7 | W0c7 | W4d8 | W0d8 | W4d7 | W0d7 |
| B0 | LaD7 | LaD6 | LaD5 | LaD4 | LaD3 | LaD2 | LaD6 | LaD6 |
| | W4a8 | W0a8 | W4a7 | W0a7 | W4b8 | W0b8 | W4b7 | W0b7 |

MSB ← → LSB

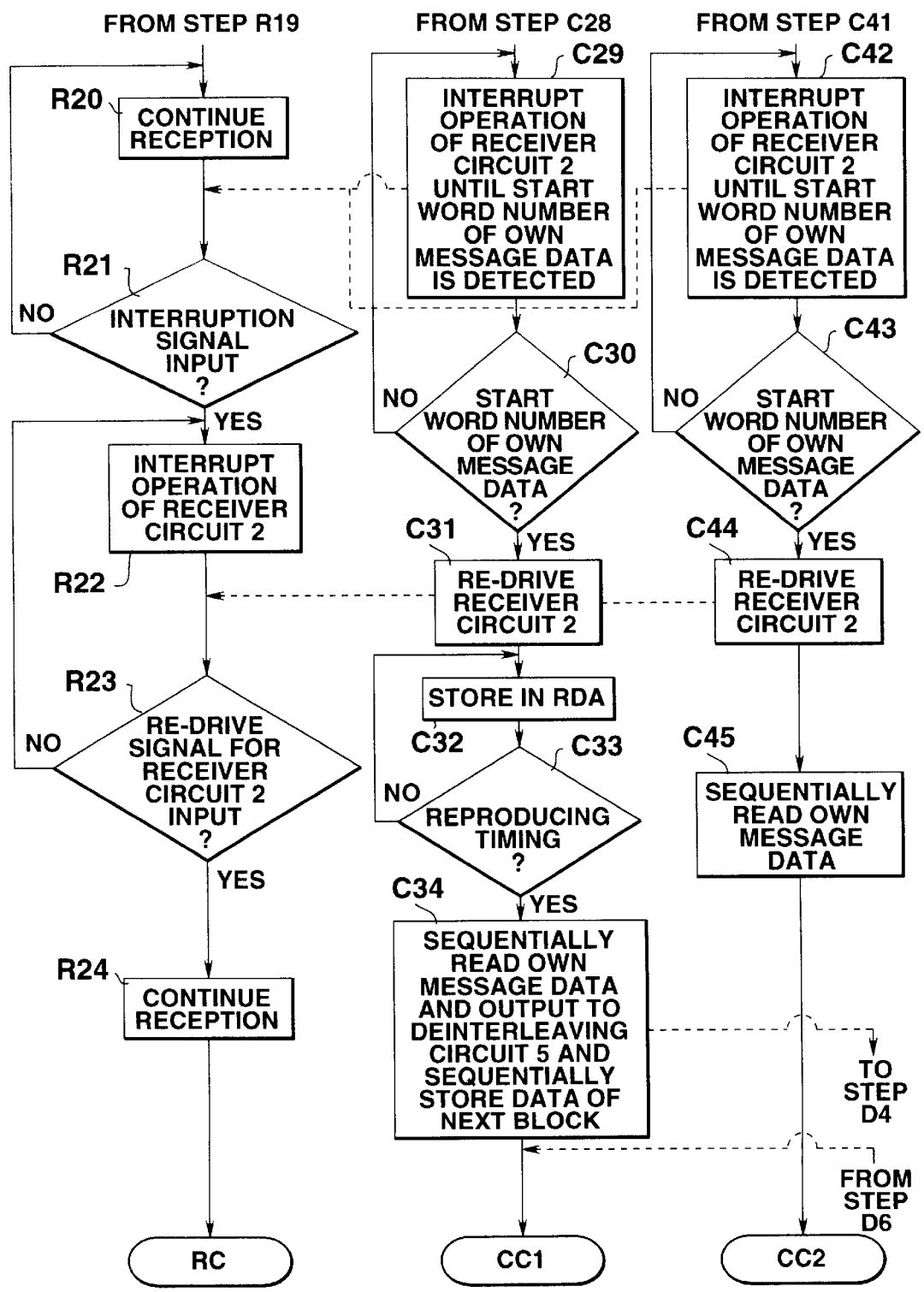

FIG.33

| WORD (W) | 1 | 2 | 3 | 4 | 5 | 6 | 7 ... 21 | 22 ... 31 | 32 |
|---|---|---|---|---|---|---|---|---|---|
| | | | | | INFORMATION | | | PARITY | CK |
| W 0a | – | – | – | – | – | – | – ... – | p ... p | p |
| W 1a | – | – | – | – | – | – | – ... – | p ... p | p |
| W 2a | – | – | – | – | – | – | – ... – | p ... p | p |
| W 3a | – | – | – | – | – | – | – ... – | p ... p | p |
| W 4a | – | – | – | – | – | – | – ... – | p ... p | p |
| W 5a | – | – | – | – | – | – | – ... – | p ... p | p |
| W 6a | – | – | – | – | – | – | – ... – | p ... p | p |
| W 7a | – | – | – | – | – | – | – ... – | p ... p | p |

α (vertical), β (horizontal)

DATA RECEIVING APPARATUS AND METHOD OF DEINTERLEAVING DATA

BACKGROUND OF THE INVENTION

The present invention relates to a data receiving apparatus and a method of deinterleaving data for reproducing data transmitted by a modulation mode at a frame speed (or transmission rate) and by an interleaving mode arbitrarily selected from predetermined modulation modes, frame speeds and interleaving modes.

Hitherto, the NTT system and POCSAG system have been known as paging (wireless paging) systems.

The POCSAG system employs, for example, the binary FSK (Frequency Shift Keying) method as a modulation mode and sets a frame speed to 512 bps (Bit/Second). When paging is performed, a paging service company transmits digital data, which has been FSK-modulated, to the called pager, at the rated frame speed. Thus, a service for communicating messages has been performed.

Meanwhile, the progress of the mobile communication technique made recently has resulted in the communication service charge being reduced, thus resulting in an increase in subscribers. As a result, addresses for the subscribers are in short supply and the traffic is always congested. Thus, the conventional POCSAG system has encountered difficulty in providing satisfactory service for the subscribers.

Since the paging service has been in a great demand and the serviceable menus have been increased recently, there arise a necessity of improving the paging system. As a result, employment as "RCR STD-43" in the future has been decided as the next standard system.

The foregoing paging system (hereinafter called "STD-43") will briefly be described. The structure of data, which is employed in STD-43, is shown in FIG. 32. Referring to FIG. 32, symbol "A" shows the structure of data which is transmitted at a period of one hour and "B" shows one cycle of the data structure "A". Symbol "C" shows the structure of data in one frame of the cycle structure "B". Symbol "D" shows the block structure of one frame. The data structure "A" is composed of 15 cycles respectively given numbers "No. 0" to "No. 14".

The cycle structure "B" is composed of 128 frames respectively given numbers "No. 0" to "No. 127", which are transmitted at a period of four minutes. One frame has a data length of 1.875 seconds. Data in one frame of the frame structure cycle is sectioned into 8 sections corresponding to the contents of data.

The eight sections; of the data contents are as indicated in the data structure "C" and the block structure "D", composed of sync structure D1 composed of, when viewed from the leading end, synchronization 1 (S1)C1, frame information (F1) C2 and synchronization 2 (S2)C3 and arranged to be transmitted at 115 ms (milliseconds); and interleaved block structure D2 composed of block information (BI) C4, address field (AF)C5, vector field (VF)C6, message field (MF)C7 and idle blocks (IB)C8 and arranged to be transmitted at a frame speed of 160 ms for each block so that 11 blocks are transmitted.

In the synchronizing signal section D, the synchronization 1 (S1)C1 is composed of 112-bit 2-level FM data (binary-FSK-modulated data, in detail) at 1600 bps, the synchronization 1 (S1)C1 containing frame pattern data including information of frame receiving timing, timing for receiving 1600 bps symbol data and the transmitted type selected from the following four frame types/rates with which the interleaving block portion D1 is interleaved/transmitted:

1. 2-Level FM 1600 bps (Binary FSK Modulation/1600 bps)
2. 2-Level FM 3200 bps (Binary FSK Modulation/3200 bps)
3. 4-Level FM 3200 bps (Quadruple FSK Modulation/3200 bps)
4. 4-Level FM 6400 bps (Quadruple FSK Modulation/6400 bps).

The frame information (F1) C2 is composed of 32-bit 2-level FM data at 1600 bps and includes data (four bits) of cycle number of the cycle of the data structure "A" to which this frame belongs, data (7 bits) of the frame number of the cycle to which this frame belongs, and information of indication of plural transmitted operations and the number of the transmitted operations.

The interleaved block structure D2 formed of the synchronization 2 (S2)C3 and the block information (B1) C4 to the idle blocks (IB)C8 is data which is transmitted by means of the frame type specified by the synchronization 1 (S1)C1. The synchronization 2 (S2)C3 is a block for supplying timing information to the interleaved block structure D2 transmitted by the modulation method and the frame speed specified by the synchronization 1 (S1)C1 to enable the called pager to fetch the interleaved block structure D2.

The block information (BI)C4 is data disposed in block #0 of the interleaved block structure D2 and composed of one word. The block information (BI)C4 includes block information 1 for storing information of the word number (2 bits) which is used as the start point of address field (AF)C5 and the end point of the present field, to be described later, the word (6 bits) which is used as the start point of vector field (VF)C6 and the like, and block information items 2, 3 and 4 so that ID of the simulcast system and, if the frame number is zero, information of the actual time, time zone and system message are stored.

The address field (AF)C5 is a field for storing address data of the called pager, the data to be stored being short address (32 bits) or long address (64 bits).

The vector filed (VF)C6 and the address field (AF)C5 form a pair and the vector field (VF)C6 is a field for storing the word at which the own message data is started in a message field (MF)C7 to be described later, the word length of own message data (hereinafter simply referred to message length) and information of the data format of the own message data.

The message field (MF)C7 is a field for storing message data corresponding to information specified by the vector field (VF)C6. The idle blocks (IB)C8 is an unused block to which a pattern composed of "1" or "0" is set.

The signal format shown in FIG. 32 is, in parallel, interleaved/transmitted in a time sequential manner in independent four phases "a", "b", "c" and "d". That is, if STD-43 is employed, the paging service company uses any one of the above-mentioned four phases or two to four phases to enable data in one frame having different contents to be multiplexed so as to be transmitted simultaneously.

In STD-43, the relationship between the phases of the frame speeds is regulated as follows:

1600 bps: any one of phases "a", "b", "c" and "d" is used (multiplex degree: 1)

3200 bps: a pair of phases "a" and "c" or a pair of "b" and "d" is used (multiplex degree: 2)

6400 bps: all of the phases "a", "b", "c" and "d" are used (multiplex degree: 4)

The block structure of the interleaved block structure D2 will now be described. Referring to FIG. 32, one block is structured such that the frame speed is 160 ms. One block stores, in parallel, 8 rows (one row is called one word) for one phase, each row being composed of the following 32 bits:

Information (Information Bit): 21 bits

Parity(Check Bit): 10 bits

CK(Even-Number Parity Bit): 1 bit

The number of bits of data in one block is different depending upon the frame speed. The relationship between the frame speeds and the number of bits of data in one block is as follows:

1600 bps: 1 phase×8 words×32 bits=256 bits 3200 bps: 2 phases×8 words×32 bits=512 bits 6400 bps: 4 phases×8 words×32 bits=1024 bits The structure of bit data in one block at each frame speed will now be described with reference to FIG. 33 to 35. FIG. 33 shows the structure of bit data in one block at the frame speed of 1600 bps, FIG. 34 shows the structure of bit data in one block at the frame speed of 3200 bps and FIG. 35 shows the structure of bit data in one block at the frame speed of 6400 bps.

In the case where the interleaved block structure D2 is transmitted at 1600 bps, the structure of bit data in one block shown in FIG. 33 is employed. The transmitted order of bit data is, in a direction indicated by an arrow β shown in FIG. 33, as W(word)0a1, W1a1, W2a1, . . . , W5a32, W6a32 and W7a32.

In the case where transmitted at 3200 bps is performed, the structure of bit data in one block as shown in FIG. 34 is employed. The transmitted order of bit data is, in a direction indicated by an arrow β shown in FIG. 34, as W0a1, W0c1, W1a1, . . . , W6c32, W7a32 and W7c32 (in the case of 2-level FM), as W0a1 and W0c1, W1a1 and W1c1, W2a1 and W2c1, . . . , W6a32 and W6c32, W7a32 and W7c32 (in the case of 4-level FM). In the case where transmitted at 6400 bps is performed, the structure of bit data in one block as shown in FIG. 35 is employed. The transmitted order of bit data is, in a direction indicated by an arrow β shown in FIG. 35, as W0a1 and W0b1, W0c1 and W0d1, W1a1 and W1b1, W1c1 and W1d1, . . . , W6a32 and W6b32, W6c32 and W6d32, W7a32 and W7b32, W7c32 and W7d32 (in the case of 4-level FM).

As described above, STD-43 involves the number of bits of data in one block which is received at each frame speed and the interleaving mode being different. Also in the case of the frame speed of 3200 bps, the structure of bit data becomes different depending upon whether the modulation mode is 2-level FM or 4-level FM.

When a paging service company employs paging system STD-43, one frame type is selected from four types of the frame types/rates in the synchronization 1 (S1)C1 of the sync structure D1. Thus, the number of bits of data in one frame which is transmitted to the called pager can arbitrarily be changed.

Therefore, if the called pager uniformly receives, amplifies and digitizes data, which has been transmitted in the wireless manner, to simply convert 2-level FM serial data into parallel data as has been performed by the conventional POCSAG system, meaningless serial data is unintentionally transmitted. Thus, a data reproducing method adaptable to STD-43 and capable of rearranging bit data to correspond to the received frame type must be provided for the pager.

The following methods of reproducing received data to be provided for the pager have been suggested:

(1) A method in which plural types of hardware units (decoders) adaptable to the respective frame speeds and the multiplex degree are mounted on the pager; any one of the mounted hardware unit is selected so that data transmitted at any one of the frame speeds is received; and bit data of the interleaved block structure D2 of above data is reproduced in accordance with the multiplex degree and by the selected deinterleaving circuit.

(2) One type of hardware is mounted on a pager; and software for performing control to rearrange bit data in the interleaved block structure D2 in accordance with the frame type of the received data is installed so that received data is reproducing.

In the case where method (1) is employed, the pager is provided with a plurality of S/P conversion circuits for converting the serial data to the parallel data in accordance with the frame type of received data; and a rearranging circuit for rearranging the parallel data in order to separate data into each phase. In the case where method (2) is employed, one S/P conversion circuit and the rearranging circuit are provided which are controlled by software. However, in the above-mentioned case (1), the number of hardware units which receive and reproduce data and which must be provided for the pager increases. What is even worse, since the structure of each of the circuits has a complicated structure, the size of the reception processing circuit after it has been mounted cannot be reduced. In the case of (2), the software must perform a heavier task and therefore the structure of the system becomes too complicated.

BRIEF SUMMARY OF THE INVENTION

Accordingly, the present invention is achieved to solve expected problems to arise for a pager for receiving and reproducing data when STD-43 standard is employed and, thus, it is an object of the present invention to provide a data receiving apparatus and a method of reproducing received data which can keep the balance between hardware and software for use to receive and reproduce data and reduce the size of the hardware and the load which must be borne by the software.

Another object of the present invention is to provide a data receiving apparatus and a method of reproducing received data capable of adapting the above-mentioned data transmission method, keeping the balance of load distributed to hardware and software, and reducing the size of the circuit and load, which must be borne by a CPU.

In order to achieve the above-mentioned objects, according to the present invention, there is provided a data receiving apparatus comprising:

receiving means for receiving data;

plural reproducing means capable of reproducing received data having a format which can be recognized by said data receiving apparatus;

format data receiving means for receiving format data; and selection means for selecting one of said plural reproducing means in accordance with the format data received by said format data receiving means.

Therefore, the load distributed to the hardware and the software can be balanced so that the size of the circuit and the load of the CPU are reduced.

The format data denotes a frame speed and the reproducing means is selected in accordance with the received frame speed. The reproducing process rate of the reproducing means is controlled in accordance with the frame speed received by the format data receiving means.

The format data denotes a modulation mode and the reproducing means is selected in accordance with the received modulation method. The received data is converted to parallel data in accordance with the modulation method.

The format data denotes a frame speed and a modulation mode and the reproducing means is selected in accordance with the received frame speed and the modulation method. The reproducing process rate of the reproducing means is controlled in accordance with the frame speed received by the format data receiving means. The received data is converted to parallel data in accordance with the modulation method.

The data reproducing process rate of the reproducing means is controlled in accordance with a data interleaving mode. Received data is converted into parallel data in accordance with the data interleaving mode.

Since the received data is converted into parallel data in accordance with the data interleaving mode, the load distributed to hardware and software can be balanced, and thus the size of the circuit and load, which must be borne by a CPU, can be reduced.

Plural registers used for converting the received data into parallel data are provided.

When parallel data is divided into predetermined units so as to be sequentially stored, stored parallel data are read sequentially in the storing order so as to be supplied to the selected reproducing means, and reproduced parallel data is stored in the storage position from which the same has been read, the operation required to transfer data in the data transmission process is performed by, for example, a DMA circuit in place of the CPU. Thus, the load of the CPU can furthermore be reduced.

When data which is reproduced in one operation by the reproducing means selected by the selection means is stored in data storage means, when reproducing timing of the reproducing means selected by the selection means is detected, parallel data is sequentially transmitted from the data storage means to the reproducing means and simultaneously parallel data transmitted from the conversion means is sequentially stored by the data storage means, the operation required to transmit and receive data in the data transmitted process is performed by, for example, a DMA circuit in place of the CPU. Thus, the load of the CPU can furthermore be reduced.

The format data received by the format data receiving means is stored until the format data is received next.

An ID code of paging of the data receiving apparatus is stored, if the ID code is detected in reproduced data while continuing the reproducing operation of the reproducing means, the detected ID code and the stored ID code are compared with each other. If the ID codes do not coincide with each other, the reproducing operation of the reproducing means is interrupted.

By providing an interface, the data receiving operation of the data receiving apparatus is controlled in accordance with control data supplied from a connected external device through the interface. Therefore, even if data which cannot be processed by only the data receiving apparatus, it can be processed under control of the connected external device.

According to another aspect of the present invention, there is provided a method of deinterleaving data in which data received by plural rearranging circuits are reproduced into data comprising the following steps of:

receiving format data; and selecting one of said plural rearranging circuits in accordance with received format data.

According to the above method, a rearranging circuit is selected from the plural rearranging circuits in accordance with information of the data format if information (synchronization 1(S1)C1) of the data format is received. Thus, received data is reproduced by the selected rearranging circuit.

Therefore, the load of the process distributed to the hardware and the software can be balanced. Thus, the size of the circuit and the load of the CPU can be reduced.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 3 shows the correspondence between input to registers 3042 (Ra to Rh) and output from latches 3043 (La to Lh) with respect to 64-bit data supplied to the received data buffer circuit 304 shown in FIG. 2;

FIG. 4 shows the correspondence between input to the registers 3042 (Ra to Rh) and output from the latches 3043 (La to Lh) with respect to the bit data (phase "a") in α range a for one block, the frame type of which is 1600 bps (2-level FM) and which is transmitted at a frame speed of 1600 bps as shown in FIG. 32 and received by the received data buffer circuit 304 shown in FIG. 2;

FIG. 5 shows the correspondence between input to the registers 3042 (Ra to Rh) and output from the latches 3043 (La to Lh) with respect to the bit data (a pair of phases "a" and "c") in a range "α1", which is transmitted at the first time, in the range α for one block, the frame type of which is 3200 bps (2-level FM) and which is transmitted at a frame speed of 3200 bps as shown in FIG. 34 and received by the received data buffer circuit 304 shown in FIG. 2;

FIG. 6 shows the correspondence between input to the registers 3042 (Ra to Rh) and output from the latches 3043 (La to Lh) with respect to the bit data (a pair of phases "a" and "c") in a range "α 2" which is transmitted at the second time, in the range α for one block, the frame type of which is 3200 bps (2-level FM) and which is transmitted at a frame speed of 3200 bps as shown in FIG. 34 and received by the received data buffer circuit 304 shown in FIG. 2;

FIG. 7 shows the correspondence between input to the registers 3042 (Ra to Rh) and output from the latches 3043 (La to Lh) with respect to the bit data (a pair of phases "a" and "c") in a range "α 1", which is transmitted at the first time, in the range α for one block, the frame type of which is 3200 bps (4-level FM) and which is transmitted at a frame speed of 3200 bps as shown in FIG. 34 and received by the received data buffer circuit 304 shown in FIG. 2;

FIG. 8 shows the correspondence between input to the registers 3042 (Ra to Rh) and output from the latches 3043

Figure 1:
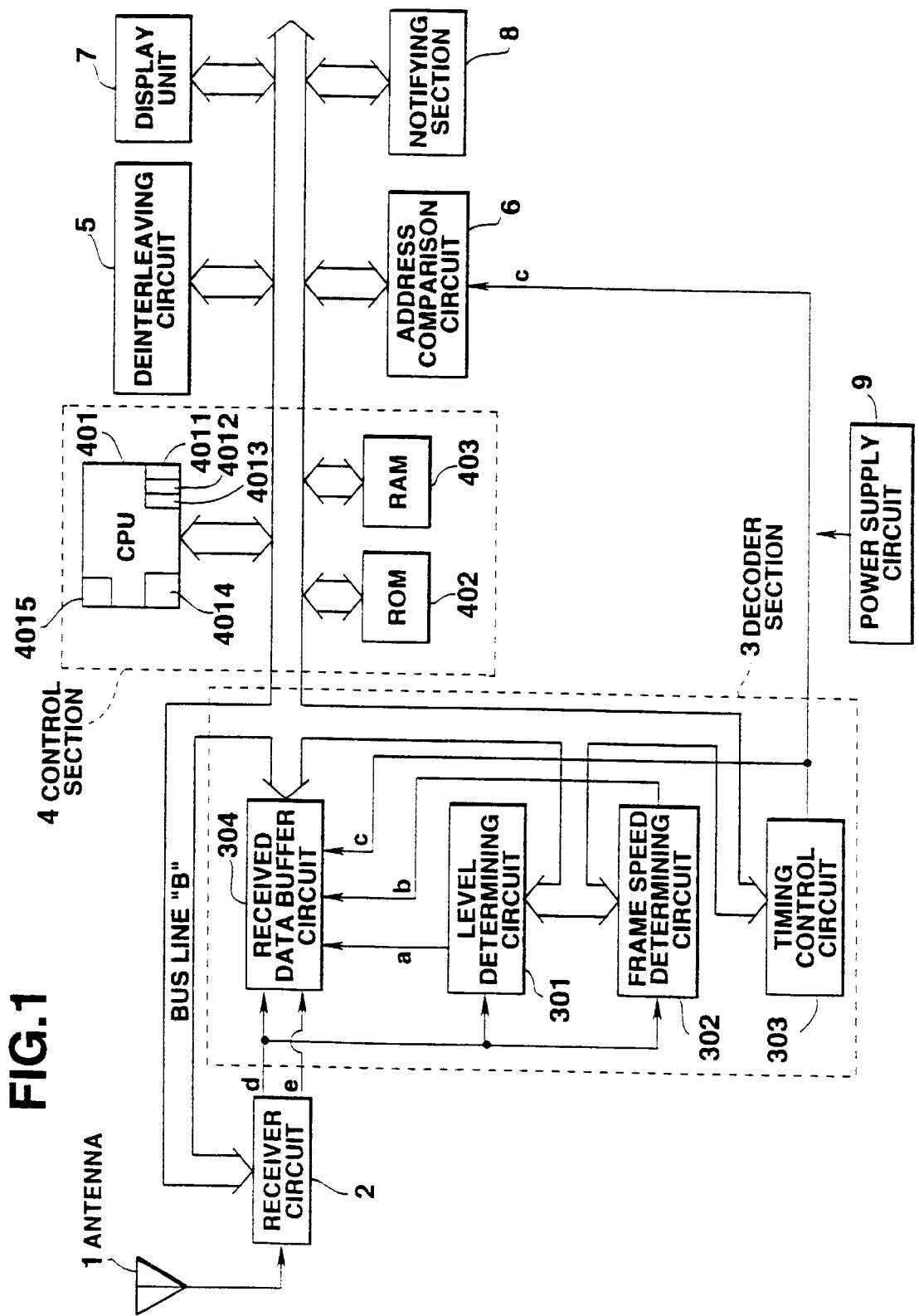
FIG. 1 is a block diagram showing a circuit of a pager which is a first embodiment of a data receiving apparatus according to the present invention.
Figure 2:
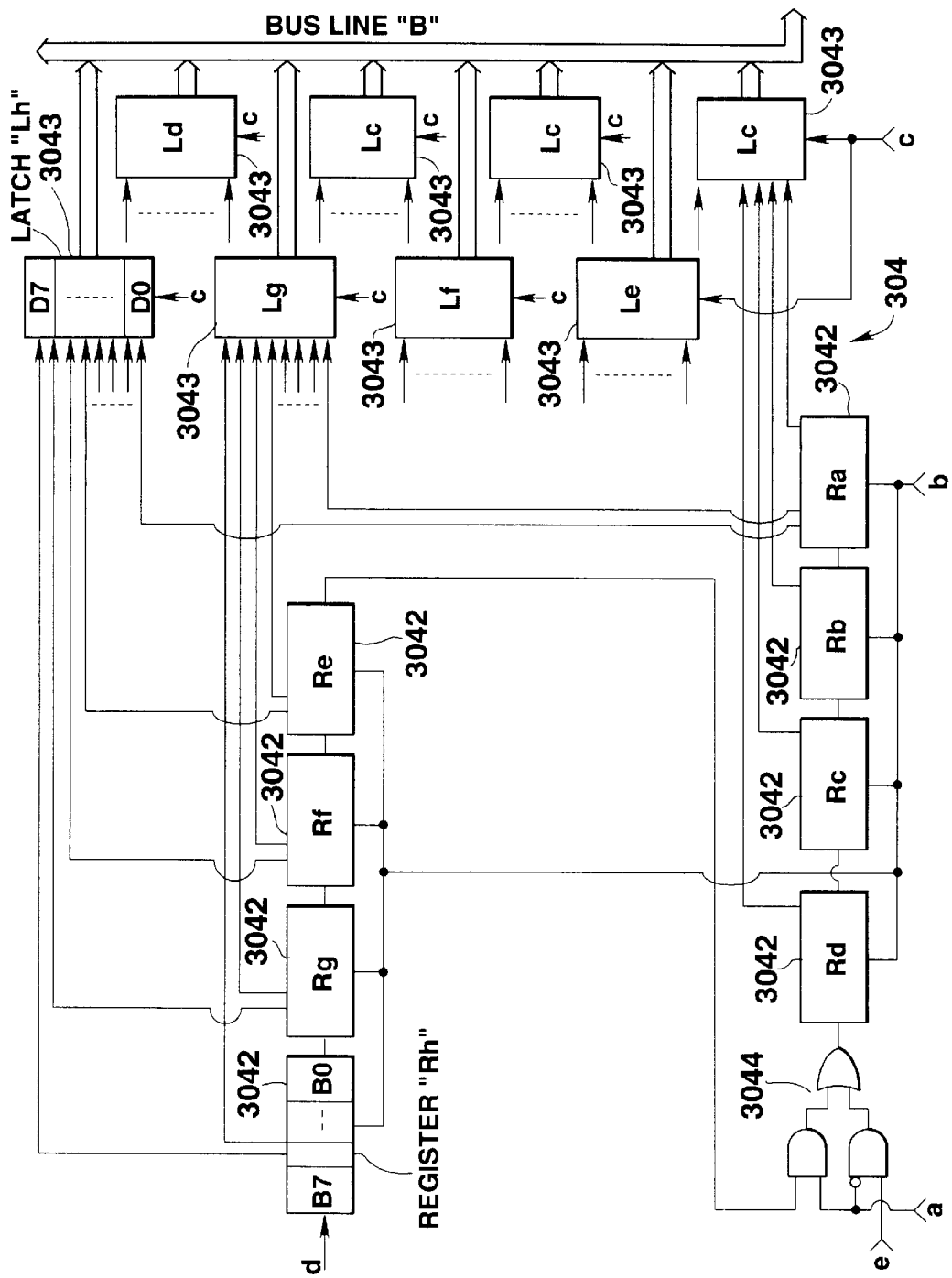
FIG. 2 is a circuit diagram showing an example of the internal structure of the received data buffer circuit 304 shown in FIG. 1.
Figure 13:
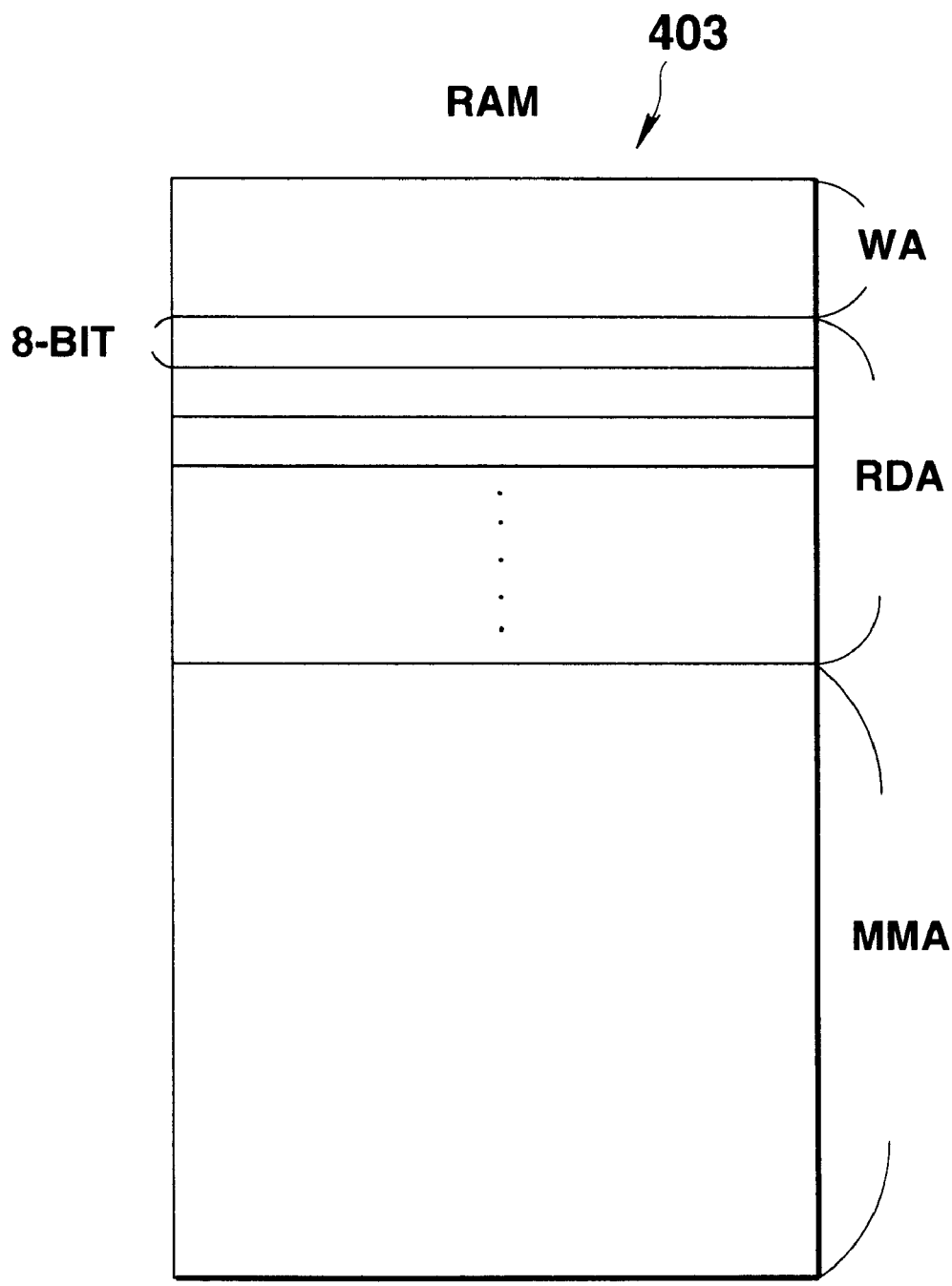
Figure 14:
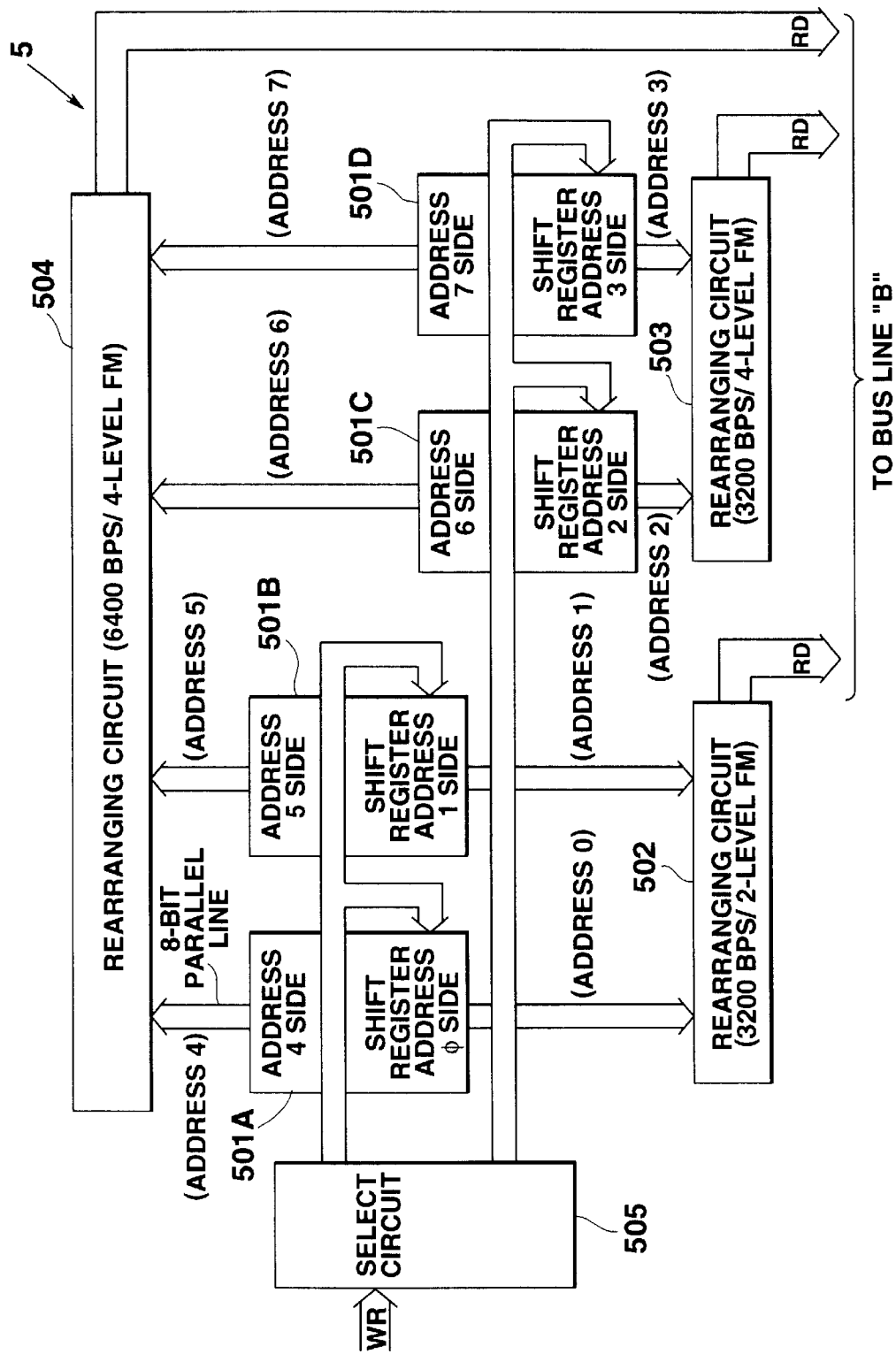
Figure 15:
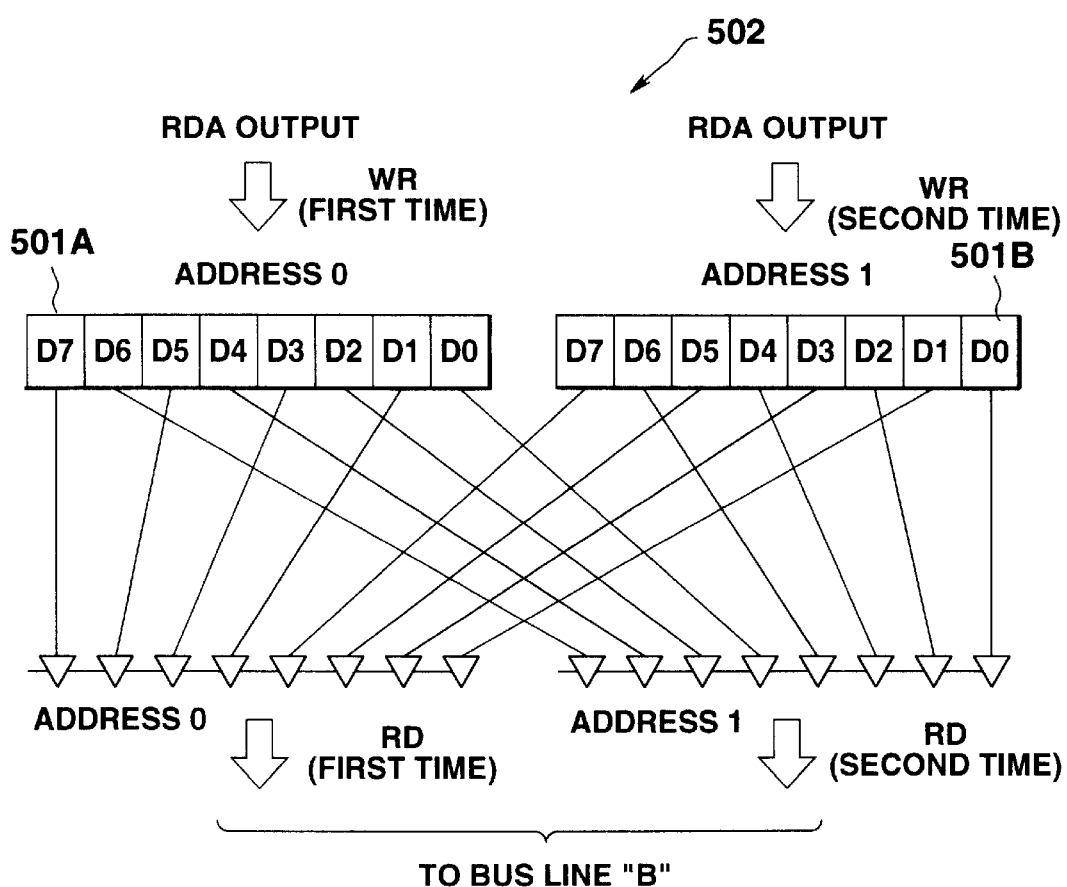
Figure 16:
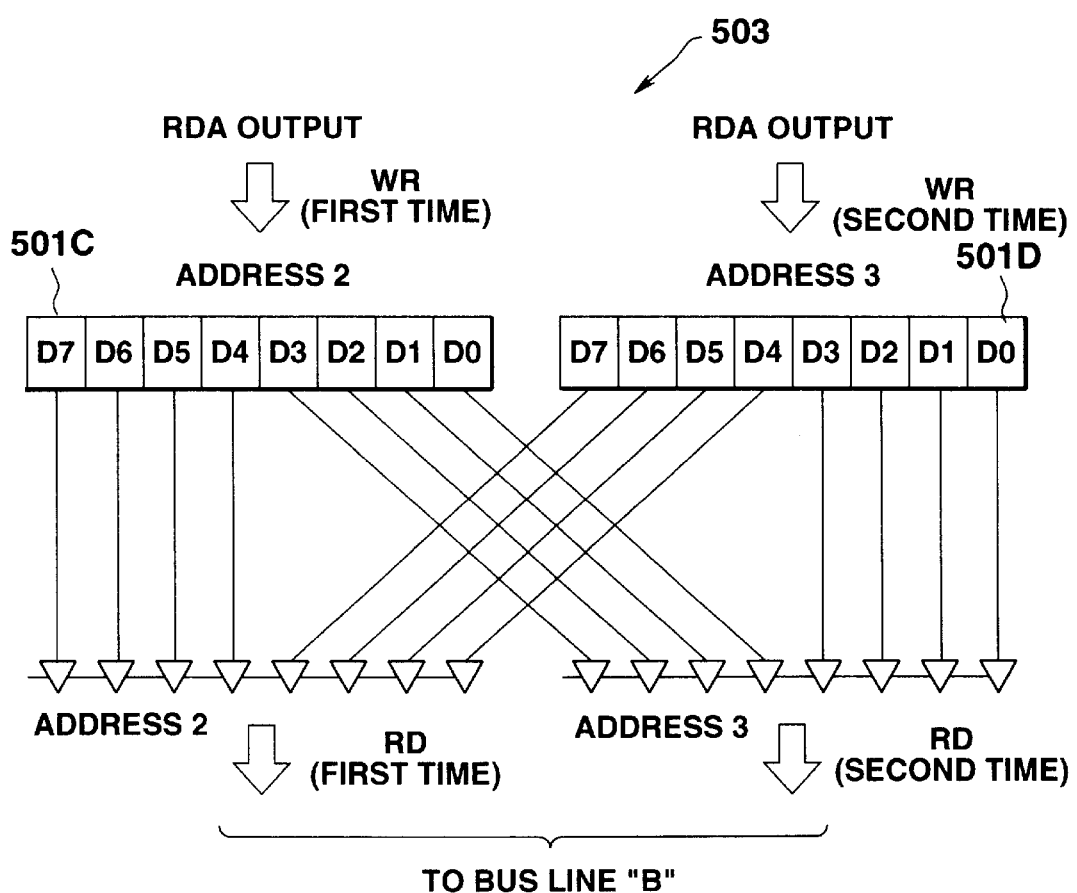
Figure 17:
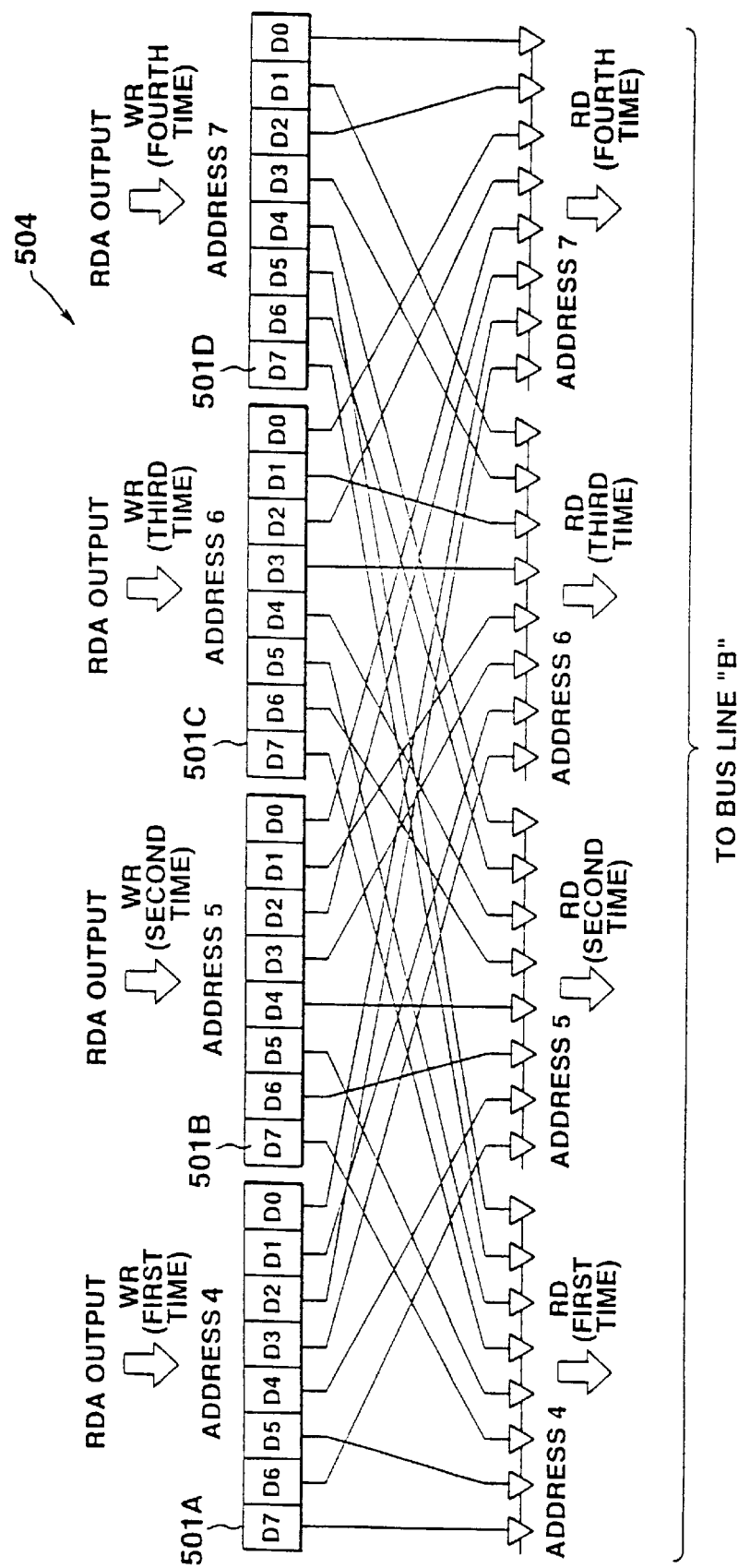
Figure 18:
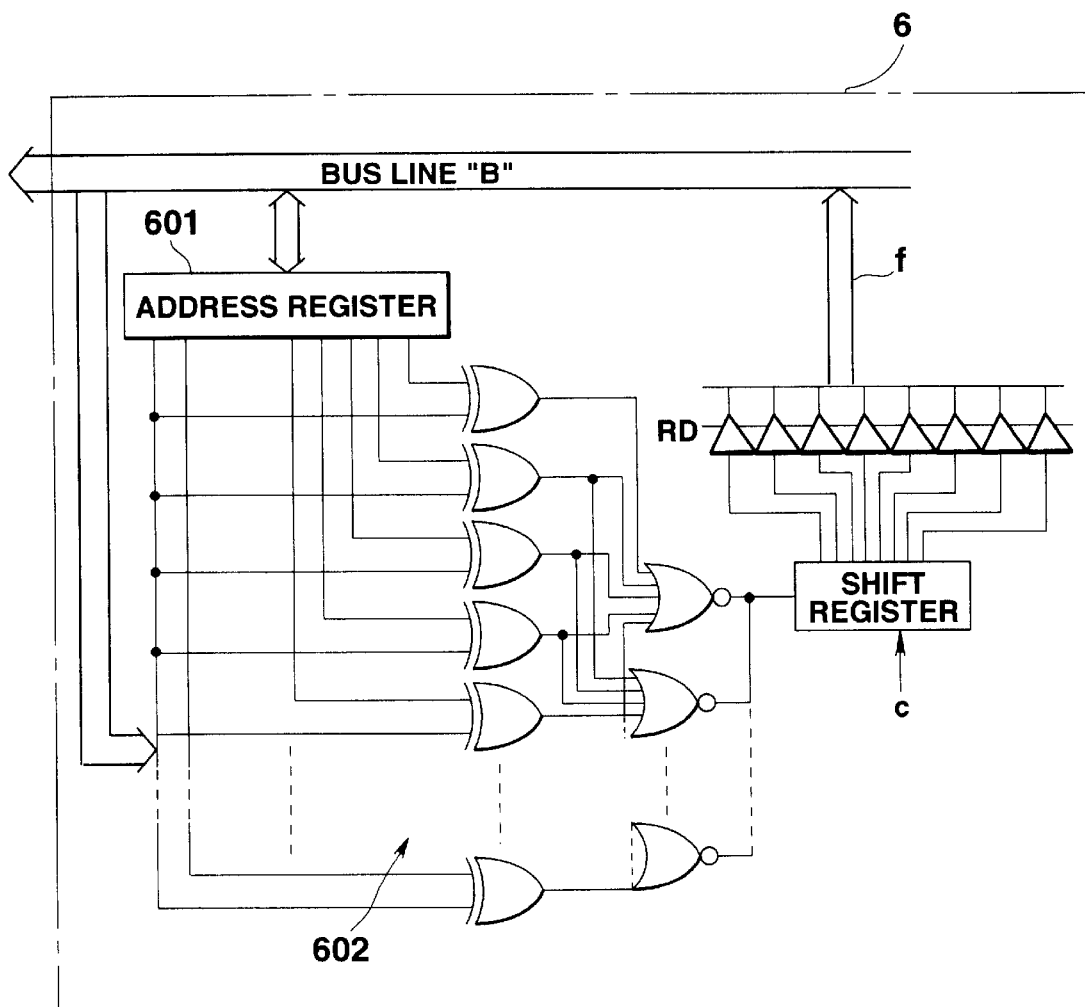
Figure 19A:
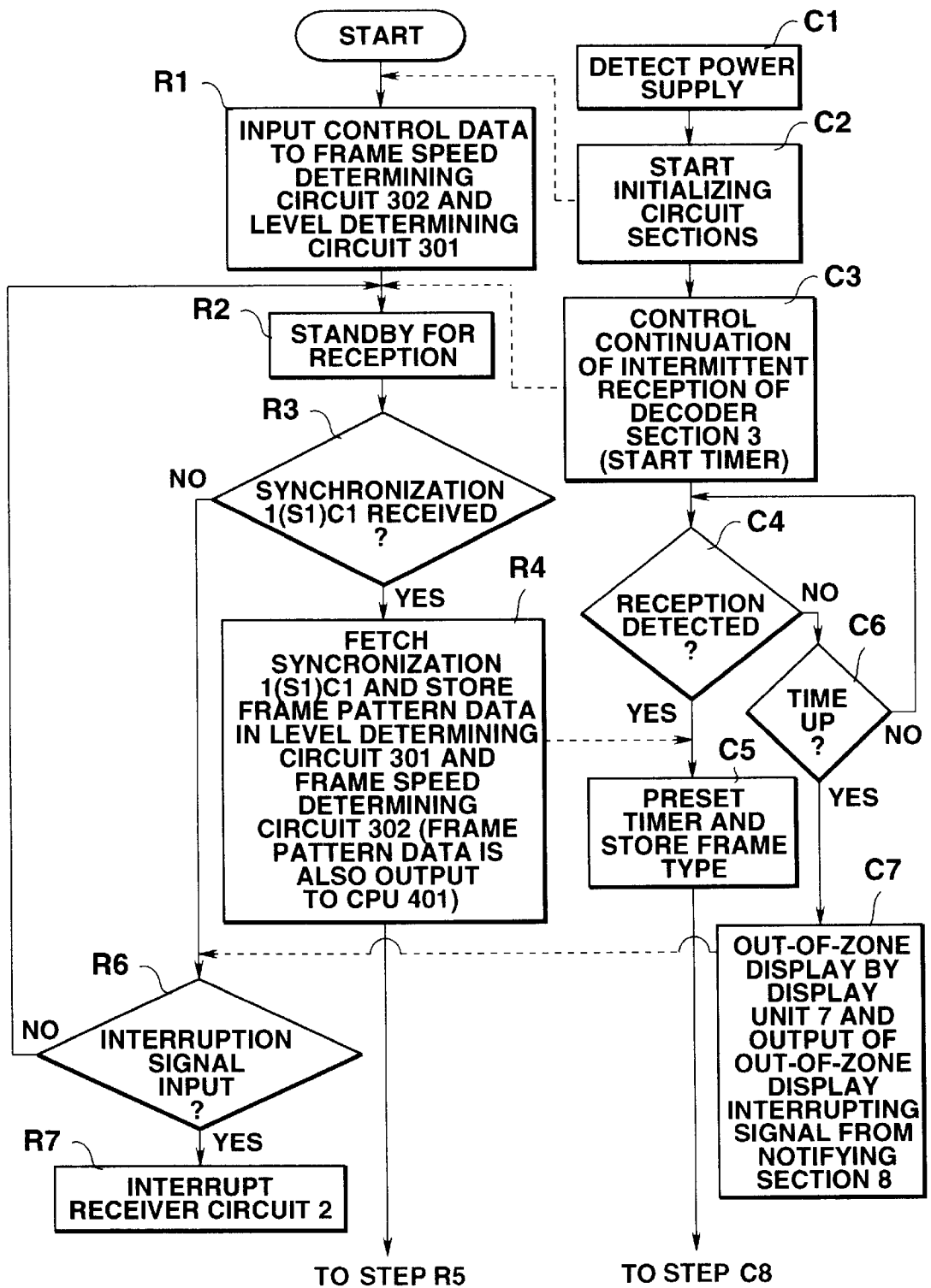
Figure 19B:
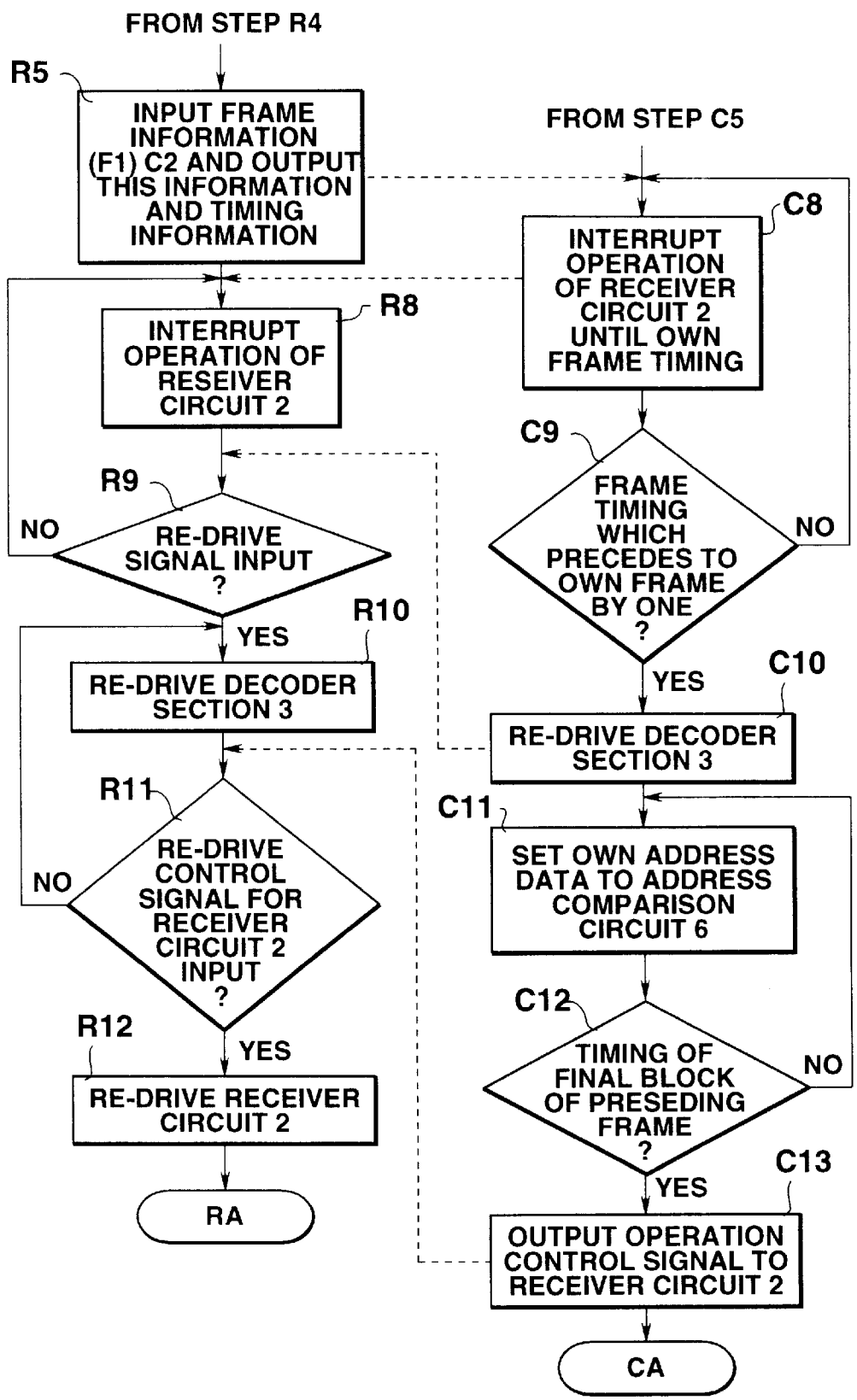
Figure 20:
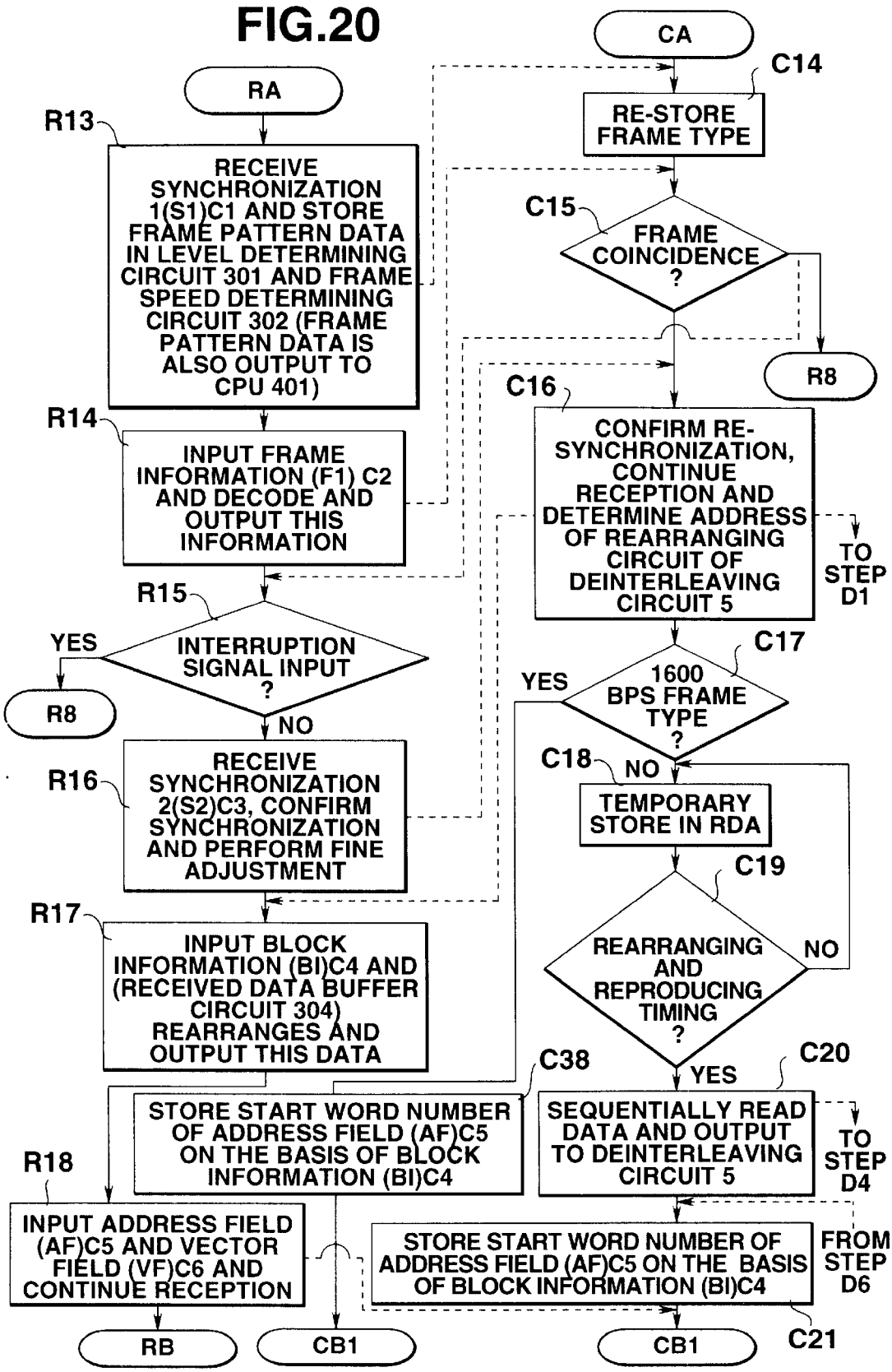
Figure 21A:
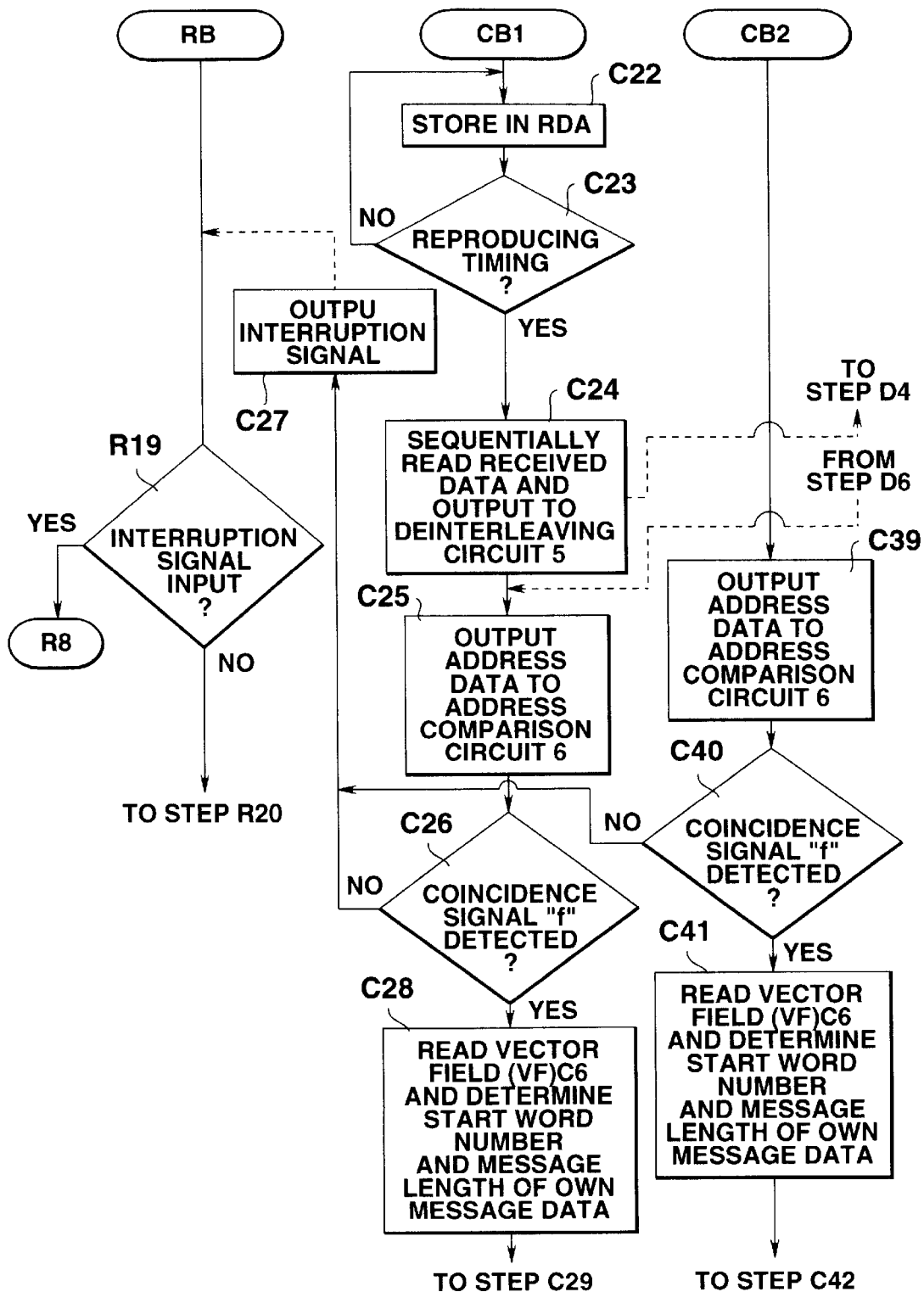
Figure 22:
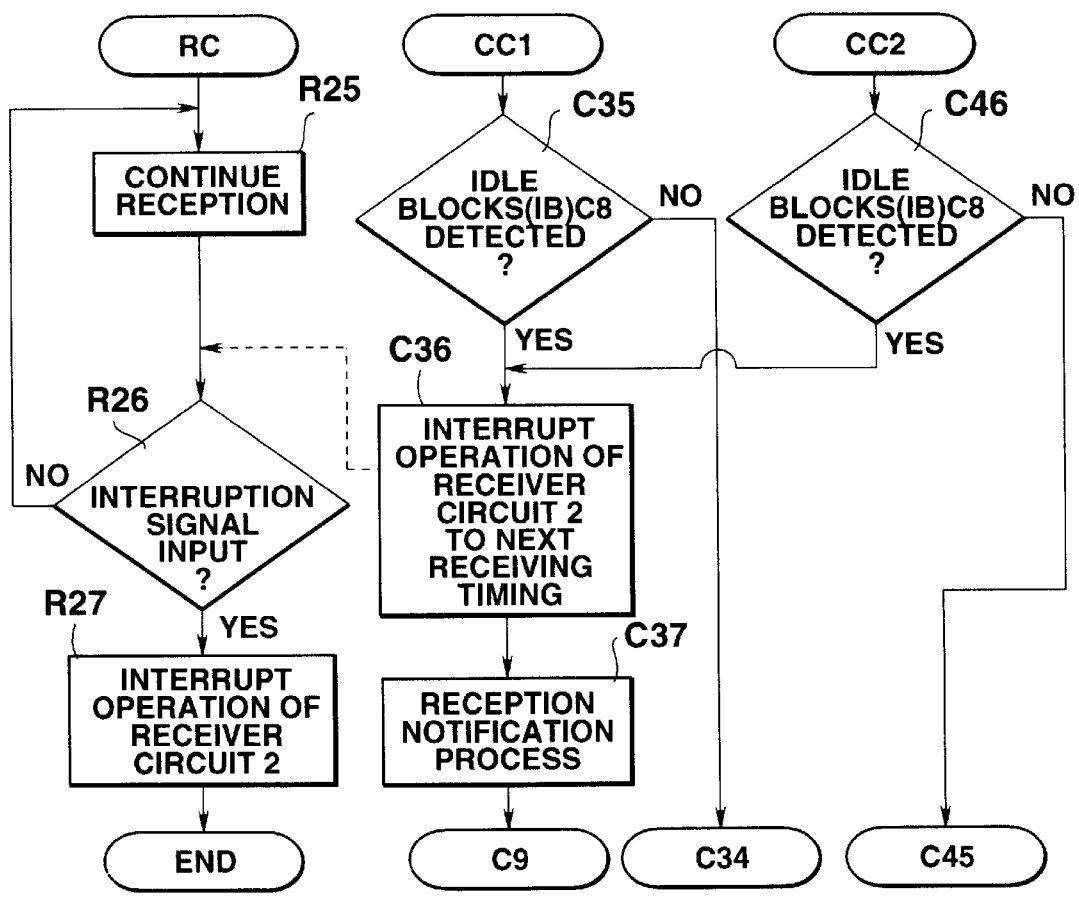
Figure 23:
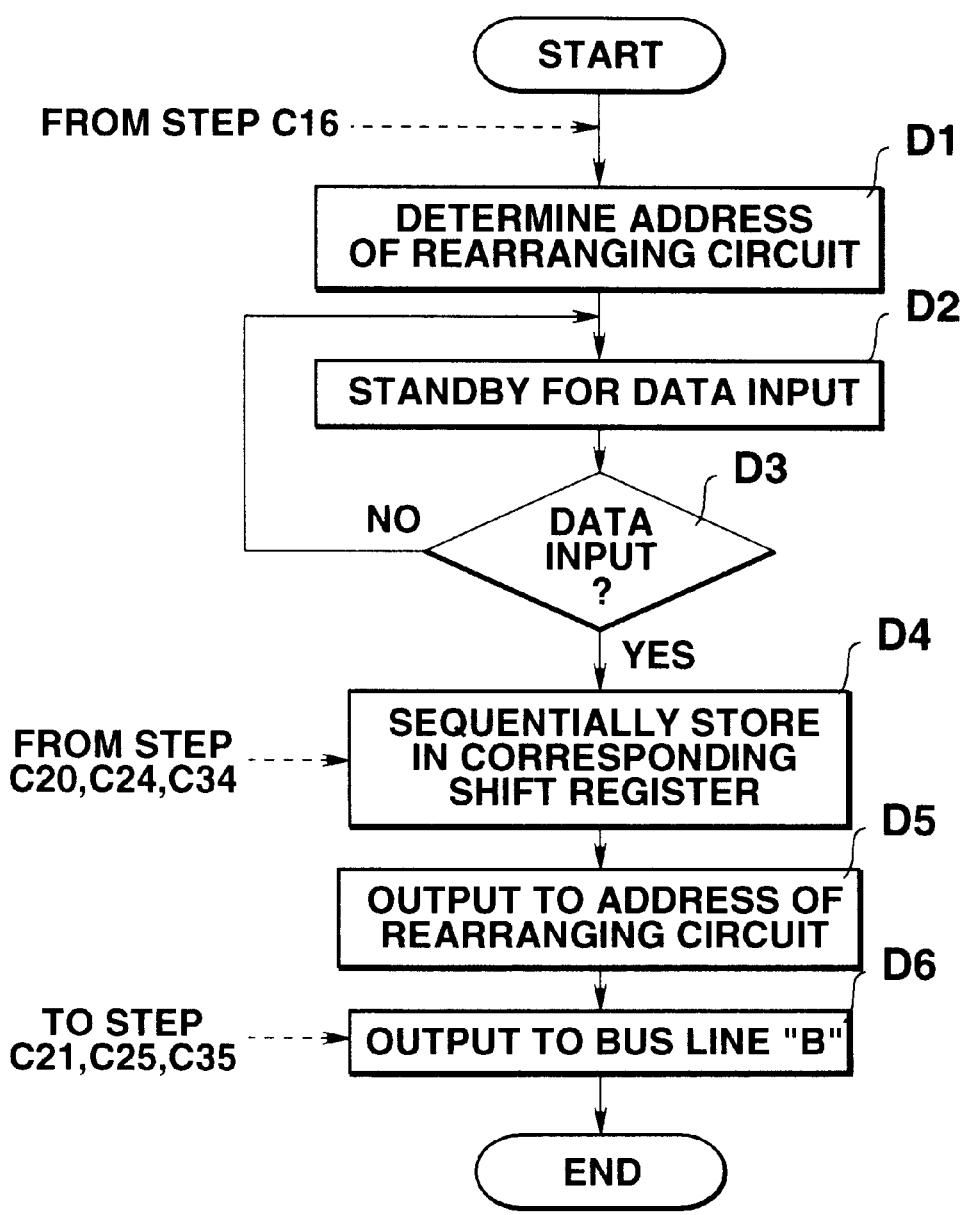
Figure 24:
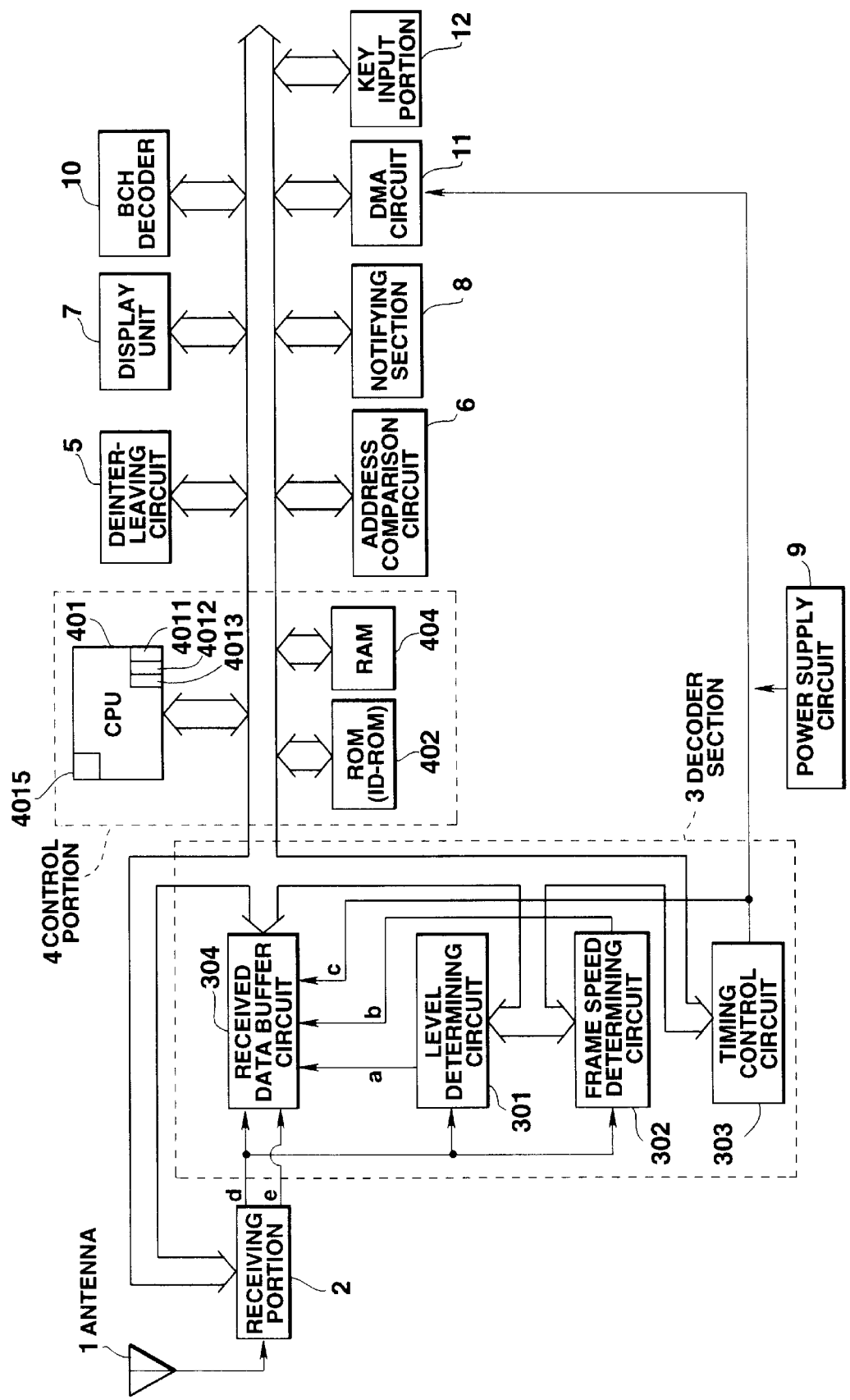
Figure 25:
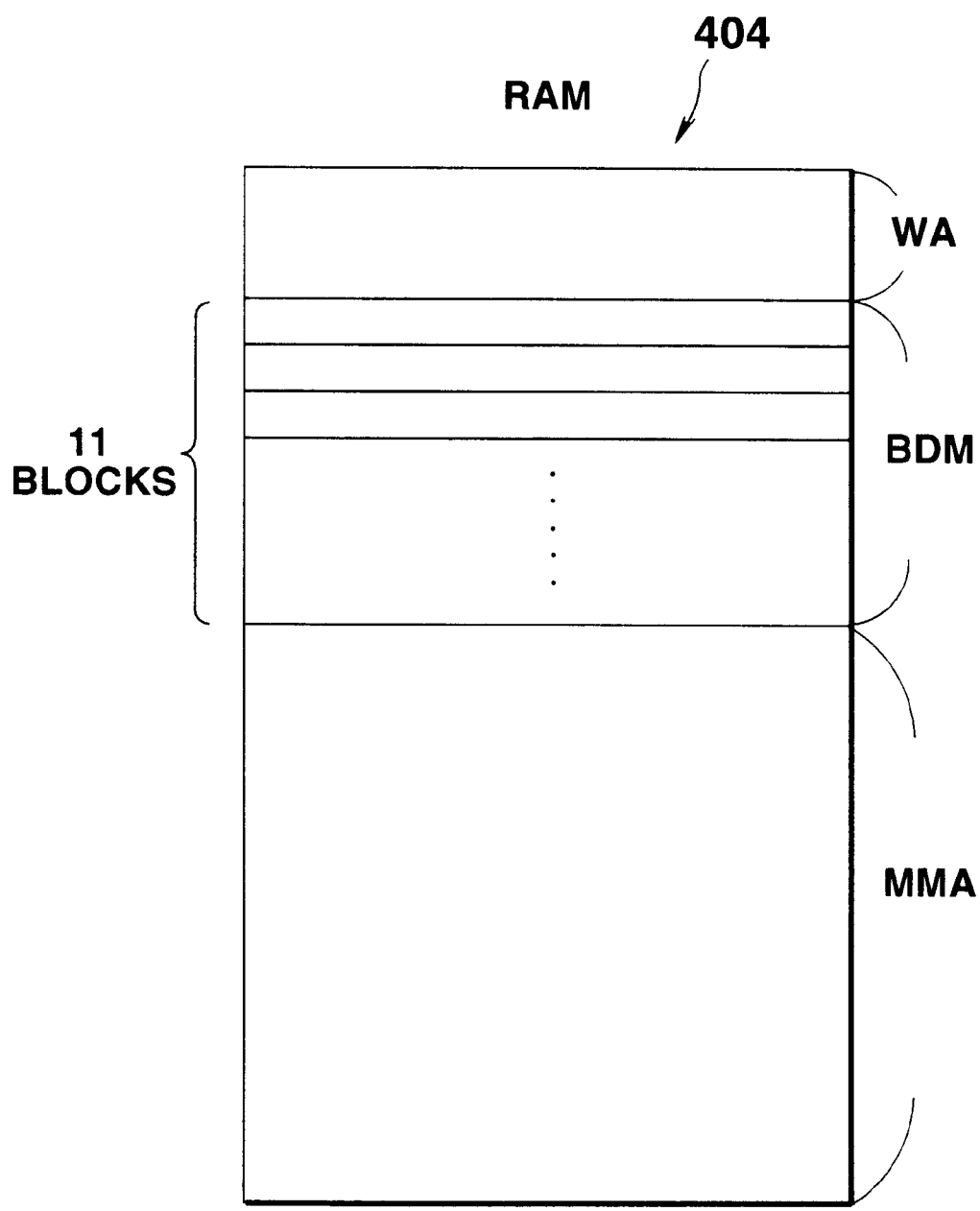
Figure 26A:
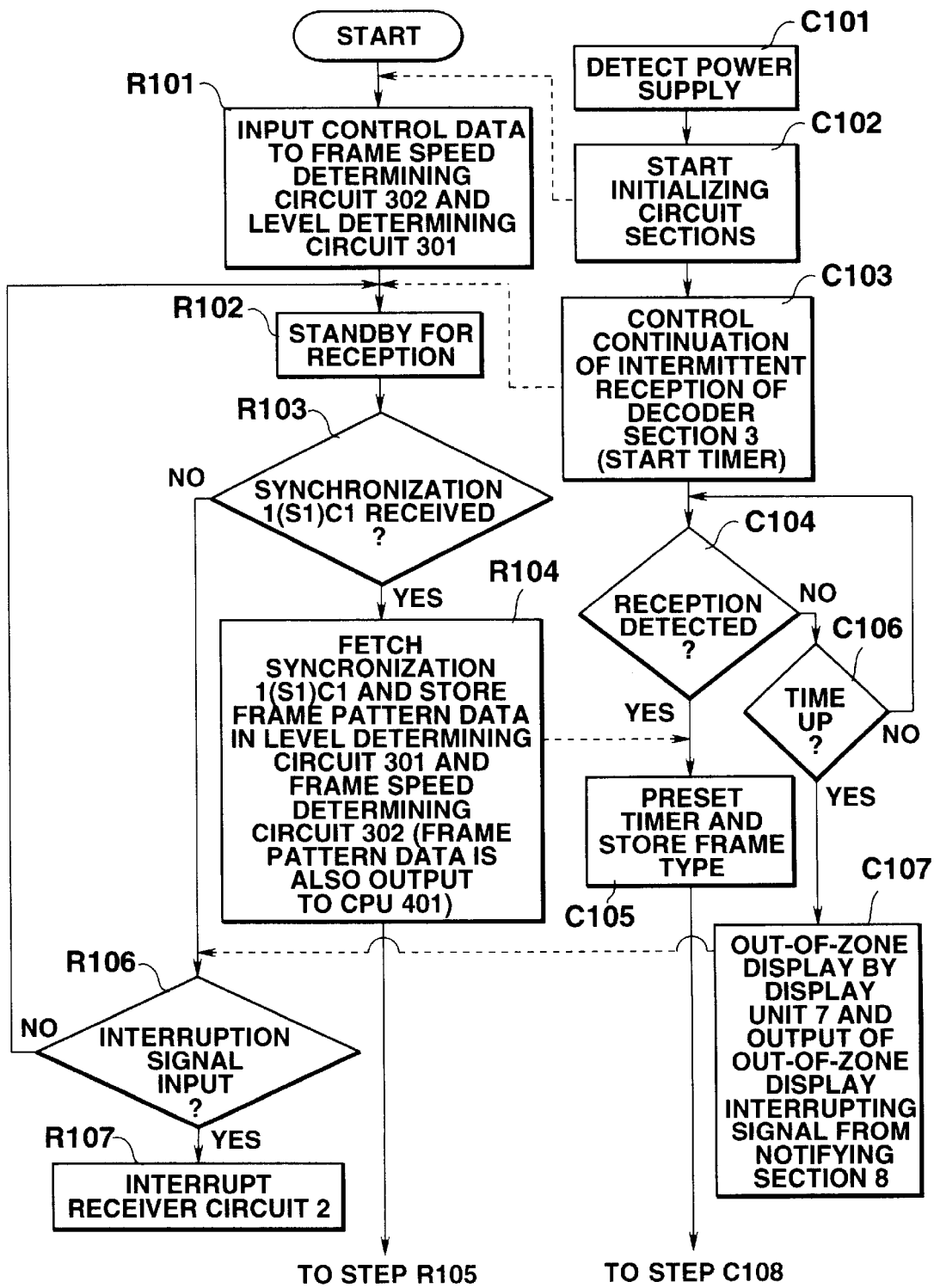
Figure 26B:
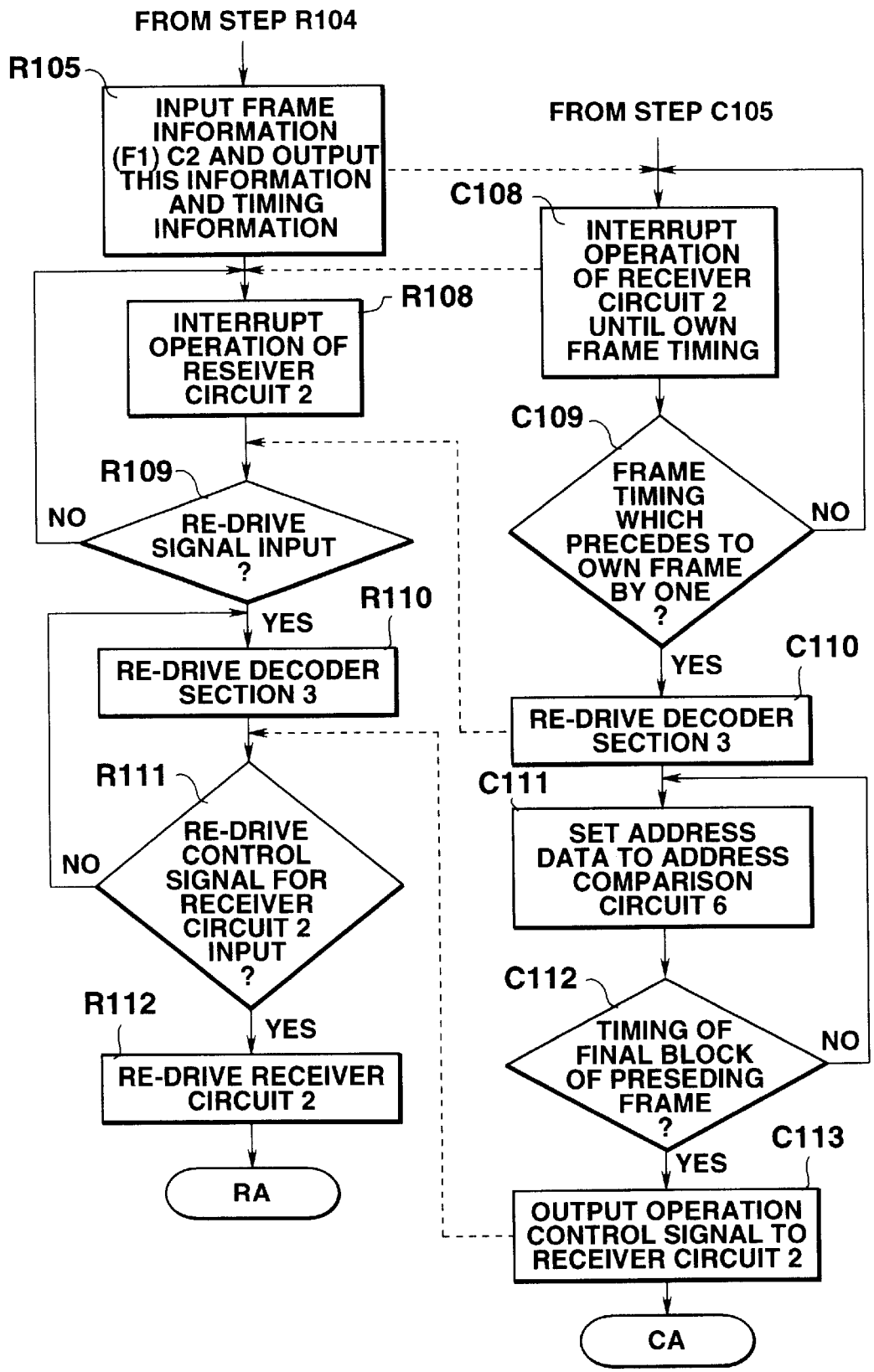
Figure 27:
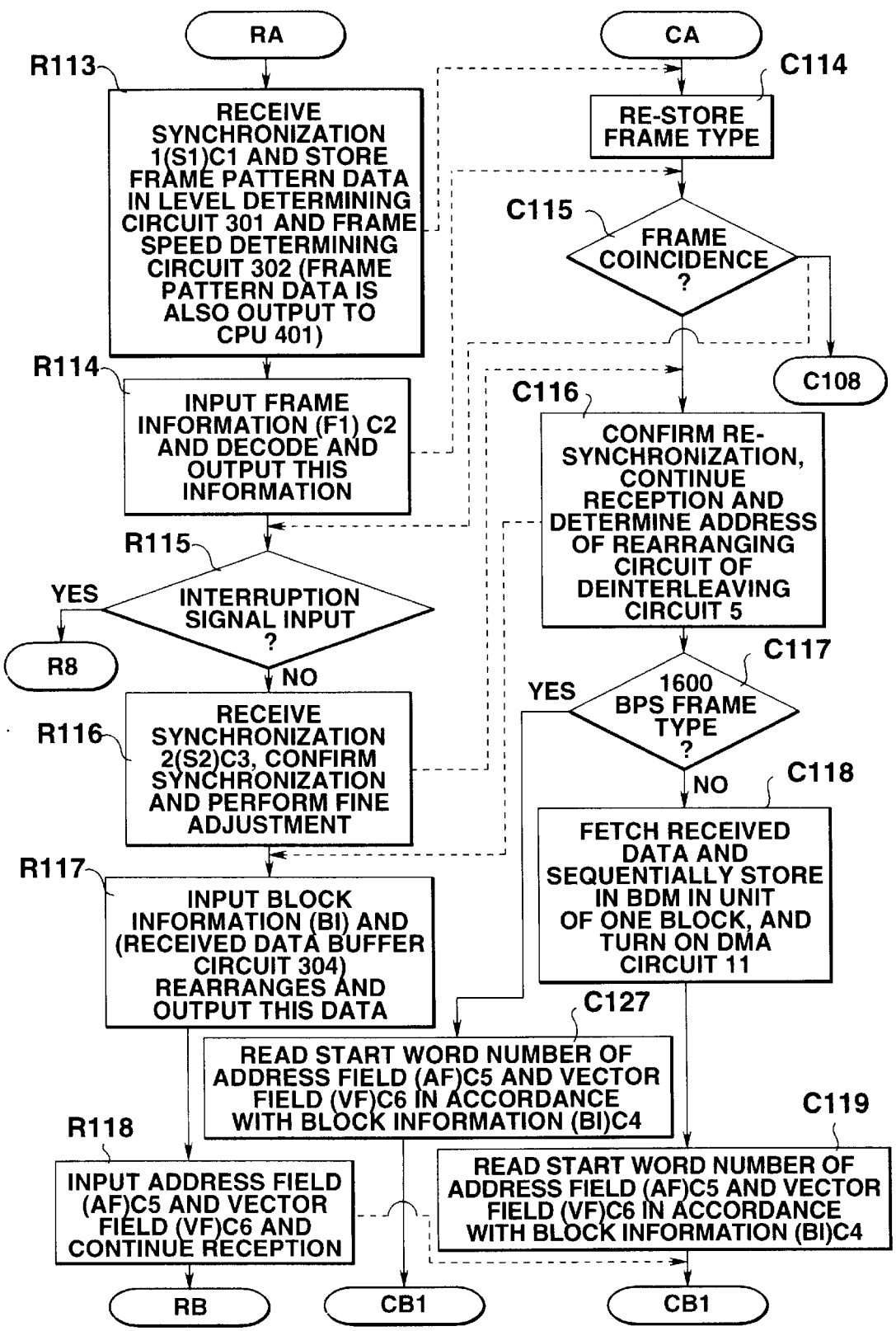
Figure 28:
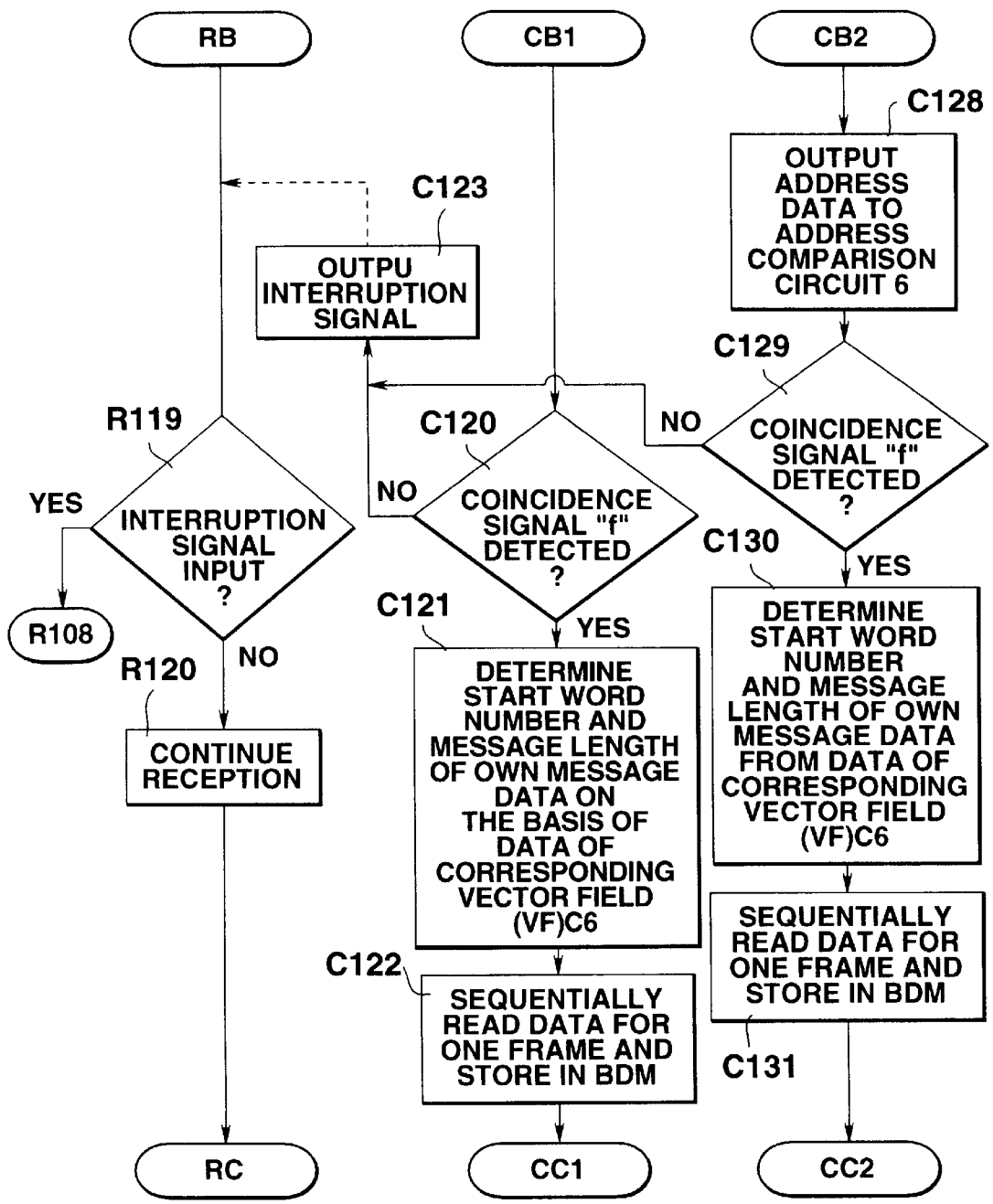
Figure 29:
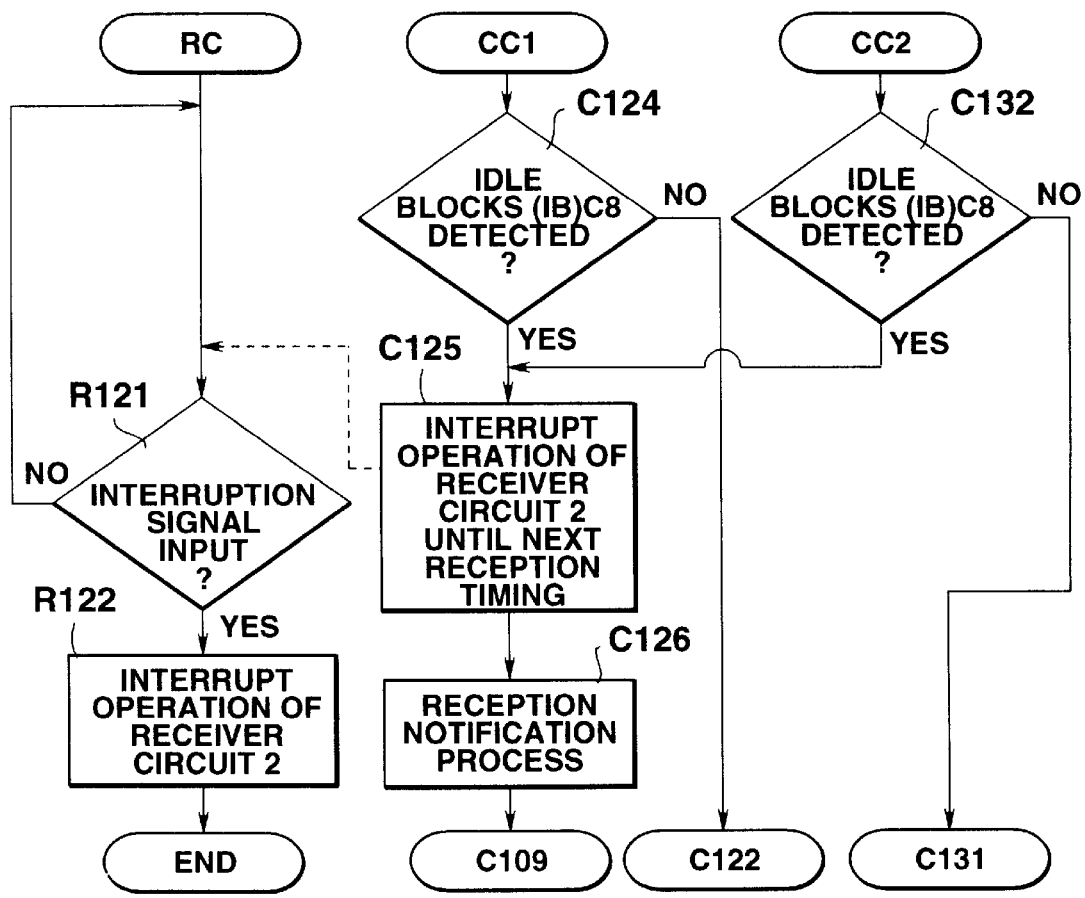
Figure 30:
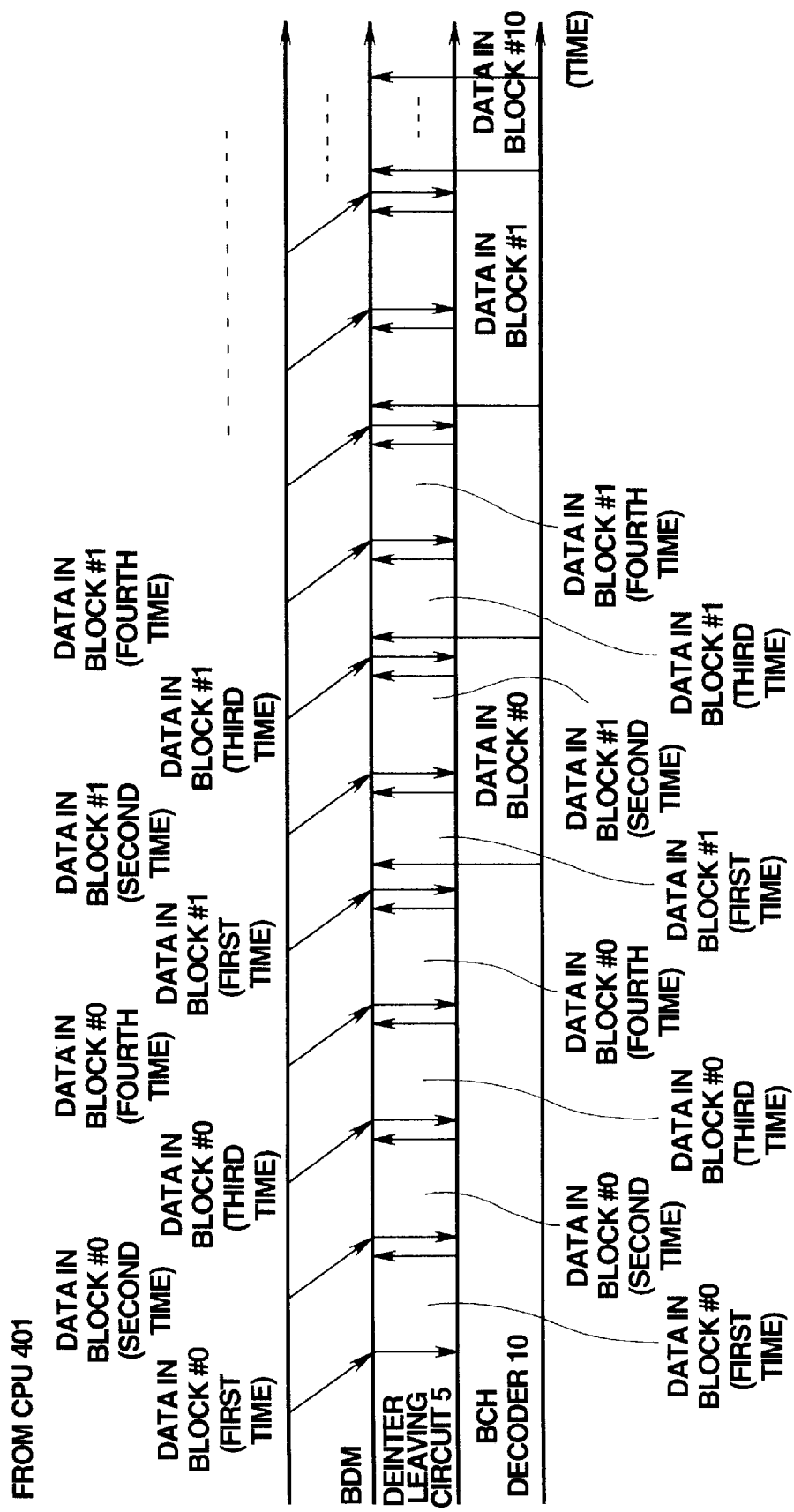
Figure 31:
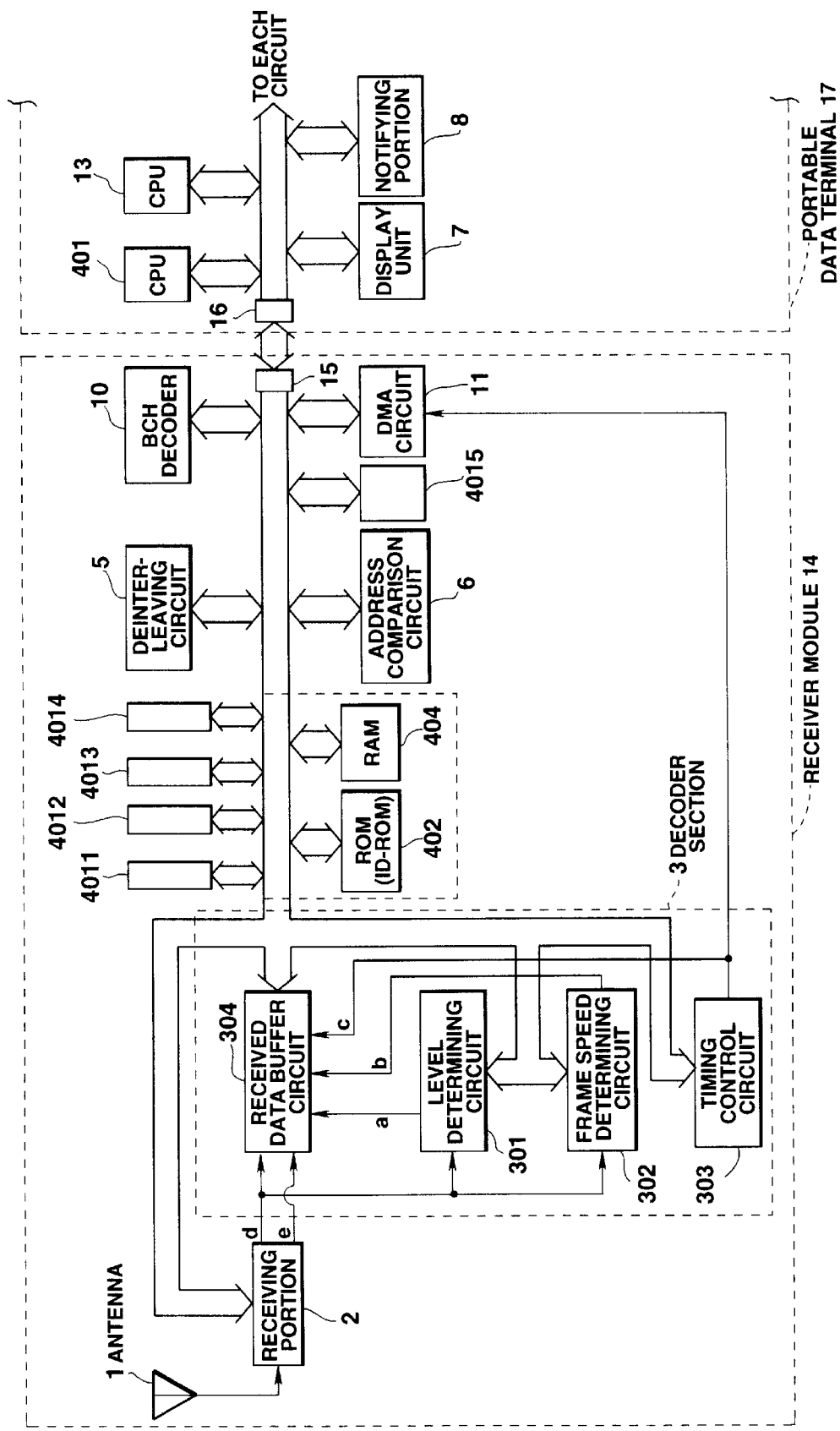
Figure 32:
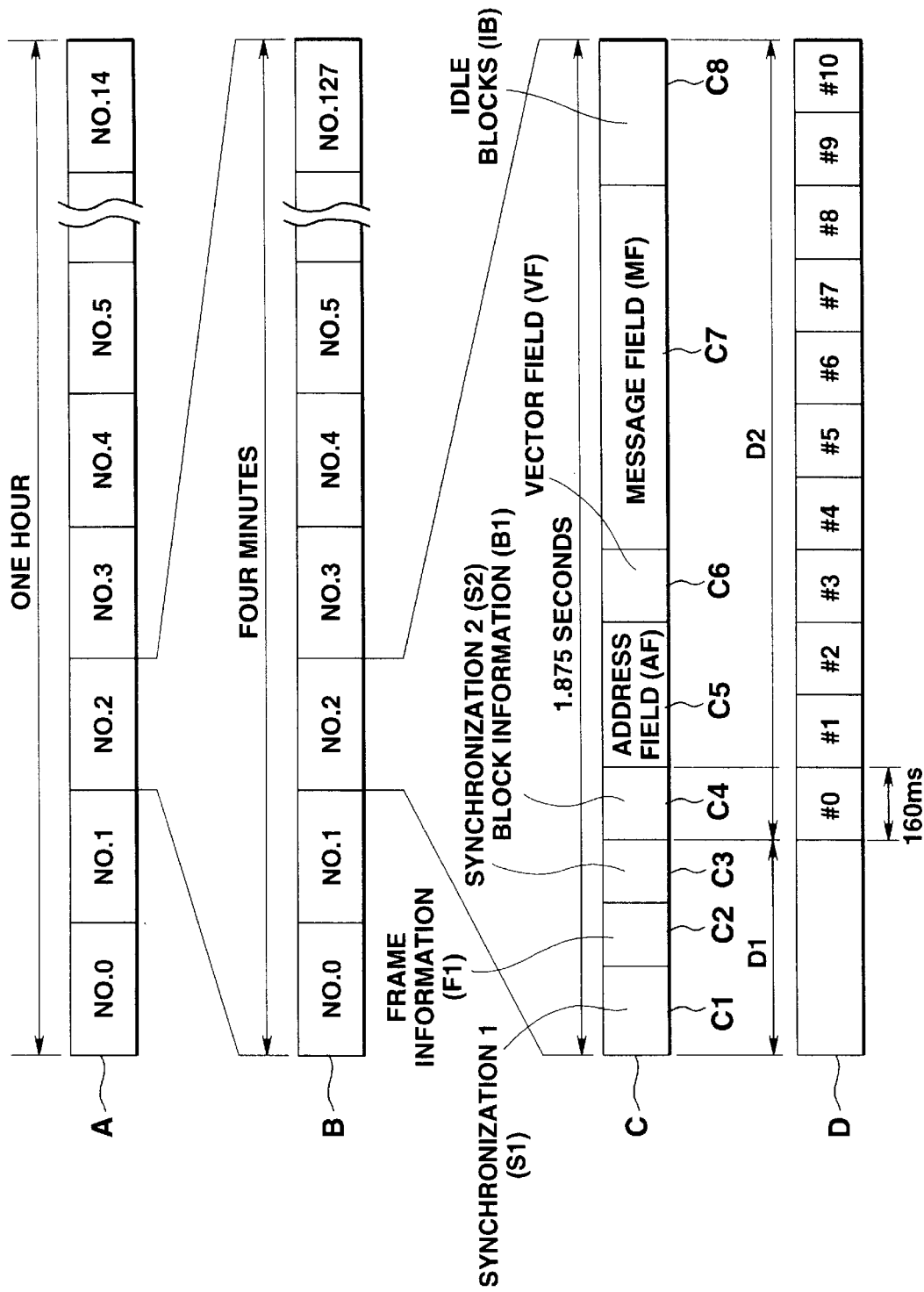
Figure 34:
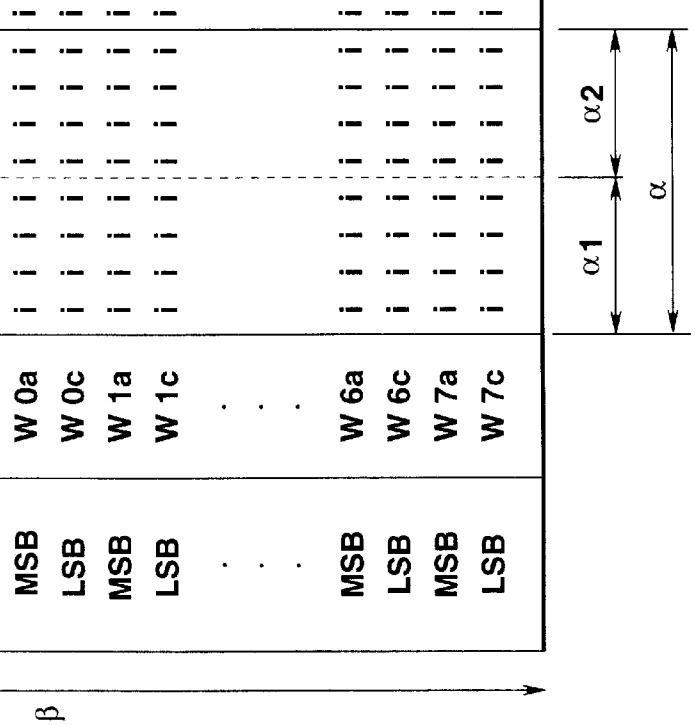
Figure 35:
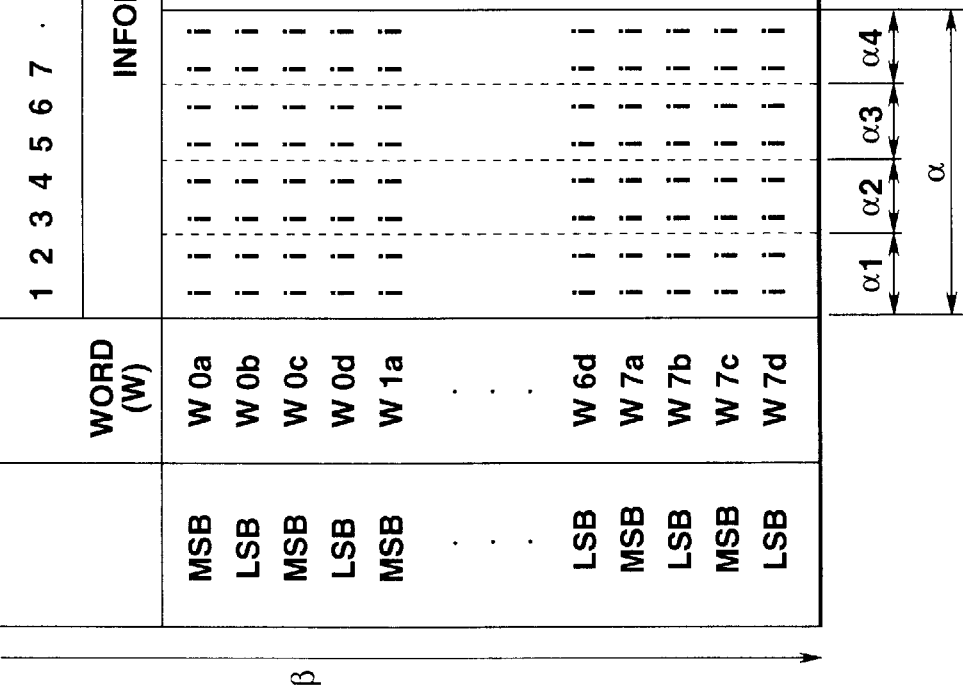

(La to Lh) with respect to the bit data (a pair of phases "a" and "c") in a range "α 2", which is transmitted at the second time, in the range α for one block, the frame type of which is 3200 bps (4-level FM) and which is transmitted at a frame speed of 3200 bps as shown in FIG. 34 and received by the received data buffer circuit 304 shown in FIG. 2;

FIG. 9 shows the correspondence between input to the registers 3042 (Ra to Rh) and output from the latches 3043 (La to Lh) with respect to the bit data in a range "α1", which is transmitted at the first time, in the range α for one block, the frame type of which is 6400 bps (4-level FM) and which is transmitted at a frame speed of 6400 bps as shown in FIG. 35 and received by the received data buffer circuit 304 shown in FIG. 2;

FIG. 10 shows the correspondence between input to the registers 3042 (Ra to Rh) and output from the latches 3043 (La to Lh) with respect to the bit data in a range "α 2", which is transmitted at the second time, in the range α for one block, the frame type of which is 6400 bps (4-level FM) and which is transmitted at a frame speed of 6400 bps as shown in FIG. 35 and received by the received data buffer circuit 304 shown in FIG. 2;

FIG. 11 shows the correspondence between input to the registers 3042 (Ra to Rh) and output from the latches 3043 (La to Lh) with respect to the bit data in a range "α 3", which is transmitted at the third time, in the range α for one block, the frame type of which is 6400 bps (4-level FM) and which is transmitted at a frame speed of 6400 bps as shown in FIG. 35 and received by the received data buffer circuit 304 shown in FIG. 2;

FIG. 12 shows the correspondence between input to the registers 3042 (Ra to Rh) and output from the latches 3043 (La to Lh) with respect to the bit data in a range "α 4", which is transmitted at the fourth time, in the range α for one block, the frame type of which is 6400 bps (4-level FM) and which is transmitted at a frame speed of 6400 bps as shown in FIG. 35 and received by the received data buffer circuit 304 shown in FIG. 2;

FIG. 13 is a diagram showing an example of the structure of memory areas of the RAM 403 shown in FIG. 1;

FIG. 14 is a block diagram showing an example of the structure of the deinterleaving circuit 5 shown in FIG. 1;

FIG. 15 is a diagram showing a rearranging operation which is performed by a rearranging circuit 502;

FIG. 16 is a diagram showing the rearranging operation which is performed by a rearranging circuit 503;

FIG. 17 a diagram showing the rearranging operation which is performed by a rearranging circuit 504;

FIG. 18 is a circuit diagram showing an example of the internal structure of the address comparison circuit 6 shown in FIG. 1;

F1GS. 19A and 19B are a flow chart showing a data receiving operation which is performed by the pager according to the first embodiment of the present invention;

FIG. 20 is a flow chart showing the data receiving operation which is performed by the pager according to the first embodiment of the present invention;

F1GS. 21A and 21B are a flow chart showing the data receiving operation which is performed by the pager according to the first embodiment of the present invention;

FIG. 22 is a flow chart showing the data receiving operation which is performed by the pager according to the first embodiment of the present invention;

FIG. 23 is a flow chart showing a reproducing operation which is performed by the deinterleaving circuit 5 of the pager according to the first embodiment of the present invention;

FIG. 24 is a block diagram showing a circuit of a pager according to a second embodiment of the data receiving apparatus according to the present invention;

FIG. 25 is a diagram showing an example of the structure of memory areas in the RAM 404 shown in FIG. 24;

F1GS. 26A and 26B are a flow chart showing a data receiving operation which is performed by the pager according to the second embodiment of the present invention;

FIG. 27 is a flow chart showing the data receiving operation which is performed by the pager according to the second embodiment of the present invention;

FIG. 28 is a flow chart showing the data receiving operation which is performed by the pager according to the second embodiment of the present invention;

FIG. 29 is a flow chart showing the data receiving operation which is performed by the pager according to the second embodiment of the present invention;

FIG. 30 is a timing chart showing a data transmitting and receiving operations which is performed by a DMA circuit 11 when the data receiving operation is performed;

FIG. 31 is a block diagram showing the structure of a circuit of a modification of the second embodiment of the present invention;

FIG. 32 is a diagram showing an example of the structure of transmitted data which is employed by pager system "RCR STD-43";

FIG. 33 is a diagram showing the structure of one block of an interleaved block structure D2 when the frame speed is 1600 bps (phase "a");

FIG. 34 is a diagram showing the structure of one block of an interleaved block structure D2 when the frame speed is 3200 bps (a pair of phases "a" and "c"); and FIG. 35 is a diagram showing the structure of one block of the interleaved block structure D2 when the frame speed is 6400 bps.

DETAILED DESCRIPTION OF THE INVENTION

A preferred embodiment of a data receiving apparatus and a method of reproducing received data according to the present invention will now be described with reference to the accompanying drawings. Note that the embodiments employ the data structure C and block structure D shown in FIG. 32.

First Embodiment

FIG. 1 is a block diagram showing the structures of circuits in a pager which is a first embodiment of a data receiving apparatus according to the present invention. The pager comprises an antenna 1, a receiver circuit 2, a decoder section 3, a control section 4, a deinterleaving circuit 5, an address comparison circuit 6, a display unit 7, a notifying section 8 and a power supply circuit 9.

The antenna 1 receives data transmitted from a transmitting station of, for example, a pager service company in the format shown in FIG. 32 to supply the received data to the receiver circuit 2.

The receiver circuit 2 is connected to the decoder section 3 and arranged to be operated in response to a control signal supplied from the decoder section 3 so as to demodulate and wave-detect the received data. The receiver circuit 2 fetches the synchronization 1 (S1)C1 to select and output serial bit data in accordance with the 2-level FM or 4-level FM modulation method. That is, when the 2-level FM modulation is performed, only "d" is output. When 4-level FM modulation is performed, MSB signal of 4-level FM bit data is output to "d" and LSB signal is output to "e".

Data included in the frame pattern data obtained by fetching the synchronization 1 (S1)C1 and relating to the modulation method, is supplied to a level determining circuit 301 through the output "d", while data relating to the frame speed is supplied to a frame speed determining circuit 302. The decoder section 3 determines the frame pattern of the interleaved block structure D2 following the synchronization 2 (S2)C3 in response to a line selection signal "a" output from the level determining circuit 301, a shift clock signal "b" output from the frame speed determining circuit 302 and a data trigger "c" output from the timing control circuit 303. Moreover, the decoder section 3 converts the detected digital data into 8-bit parallel data in accordance with the modulation method so as to supply the obtained 8-bit parallel data to a bus line "B".

The decoder section 3 includes the level determining circuit 301, the frame speed determining circuit 302, a timing control circuit 303 and a received data buffer circuit 304. Each of the level determining circuit 301 and frame speed determining circuit 302 has a buffer memory (not shown). The buffer memories store control data output from a CPU 401 of the control section 4 when initialization is performed, data included in the received frame type data which relates to the modulation method and data relating to the frame speed. Moreover, the buffer memories store control data output from the CPU 401 of the control section 4.

The level determining circuit 301 receives serial bit data "d" (data of the synchronization 1 (S1)C1) output from the receiver circuit 2 to determine the modulation method of the received data so as to generate the line selection signal "a".

The frame speed determining circuit 302 receives the serial data "d" (data of the synchronization 1 (S1)C1) output from the receiver circuit 2 so as to determine the frame type of the received data. Specifically, the frame speed determining circuit 302 determines the frame type among the following four types:

1. 1600 bps 2-Level FM (Binary FSK Modulation/1600 bps)
2. 3200 bps 2-Level FM (Binary FSK modulation/3200 bps)
3. 3200 bps 4-Level FM (Quadruple FSK modulation/3200 bps)
4. 6400 bps 4-Level FM (Quadruple FSK modulation/6400 bps)

After the frame speed determining circuit 302 has determined the frame type, it generates the shift clock signal "b".

The timing control circuit 303 has a buffer for temporarily storing timing control information obtained from the CPU 401 when the synchronizing signal portion D1 has been received. Thus, the timing control circuit 303 controls bit-synchronization and the frame-synchronization of the decoder section 3. Moreover, the timing control circuit 303 generates the data trigger "c" for controlling an output timing of 8-bit parallel data from the received data buffer circuit 304.

The received data buffer circuit 304 converts serial bit data (outputs "d" and "e") output from the receiver circuit 2 into 8-bit parallel data so as to output the 8-bit parallel data to the bus line "B". The received data buffer circuit 304 converts the above bit data in unit of 64 bits in accordance with the line selection signal "a" output from the level determining circuit 301, the shift clock signal "b" output from the frame speed determining circuit 302 and the data trigger "c" output from the timing control circuit 303 so as to sequentially output 8-bit parallel data.

The control section 4 includes a CPU 401, a ROM 402 and a RAM 403 and controls the overall operation of the pager in accordance with a control program stored in the ROM 402.

The CPU 401 has a buffer memory 4011 for temporarily storing the frame pattern data read from, for example, the synchronization 1 (S1)C1, a buffer memory 4012 for temporarily storing data (cycle number, frame number and number of plural output operations) read from the frame information (F1)C2, a buffer memory 4013 for storing block information (BI)C4 and data (the start word of the address field (AF)C4, vector field (VF)C5, and own message data in the message field (MF)C6, and the message length of own message data in the message field (MF)C6) read from the vector field (VF) C5, a buffer memory 4014 for storing reproduced data in unit of one block so as to correct errors and a clock generator 4015 for generating clocks for use to adjust the timing of the receiving process and the like.

The CPU 401 controls circuit sections connected with each data by data and clocks contained in the above one frame.

The ROM 402 stores various programs for operating the CPU 401 and ID information for storing information of the frequency bands which must be received by the own pager, frame data and address data, which are ID codes of the own pager, and phase data indicating the phase in which the ID codes are stored.

As shown in FIG. 13, the RAM 403 has a work area WA for use in an operation of the CPU 401, a data reading memory area RDA for use in reproducing the received data and a memory area MMA for use in a process for storing the received message data.

The memory area RDA is a memory area for temporarily storing 8-bit parallel data output from the decoder section 3 before it has been output to a deinterleaving circuit 5 to be described later. When the output timing to the deinterleaving circuit 5 has been detected under control of the CPU 401, the number of bits of data (16 bits if the frame speed is 3200 bps and 32 bits if the frame speed is 6400 bps) which can be reproduced is sequentially output to the deinterleaving circuit 5.

The deinterleaving circuit 5, for each phase, reproduces 16-bit data of 3200 bps (2-level FM), 16-bit data of 3200 bps (4-level FM) and 32-bit data of 6400 bps (4-level FM) in accordance with the corresponding frame pattern so as to output reproduced data to the bus line "B".

The address comparison circuit 6 operates in accordance with the data trigger "c" output from the timing control circuit 303 and which compares and collates whether address data, which is included in the reproduced address field (AF)C5, coincides with address data of the own pager.

The display unit 7 is a circuit section formed by, for example, a liquid crystal panel, a display buffer or a driver so as to display information, such as a message, on a liquid crystal panel.

The notifying section is composed of notifying means including, for example, an LED (Light Emission Diode) which is turned on or allowed to flicker to notify the receipt of message, a speaker which produces sound for notifying the same, a vibrator which is vibrated to notify the same.

The power supply circuit 9 supplies electric power to the overall circuits of the pager when a power switch (not shown) is switched on.

The decoder section 3 will now be described in detail. FIG. 2 is a circuit diagram showing the internal structure of the received data buffer circuit 304 in the decoder section 3. The received data buffer circuit 304 shown in FIG. 2 has eight registers 3042 consisting of registers Ra to Rh for, in unit of 8-bit from B0 to B7, sequentially storing serial bit data output from the receiver circuit 2 through the outputs "d" and "e"; eight latches 3043 consisting of La to Lh respectively corresponding to the foregoing registers 3042; and a line selection circuit 3044.

A principle of the operation of the decoder section 3 to convert serial bit data to 64-bit data in 8-bit parallel will now be described. FIG. 3 shows correspondence between the inputs to the registers 3042 (Ra to Rh) and the outputs from the latches 3043 (La to Lh) with respect to the 64-bit data input to the received data buffer circuit 304 in one input operation.

As can be understood from table shown in FIG. 3, serial bit data supplied to B7 of the register Rh of the registers 3042 shown in FIG. 2 is, as 8-bit parallel data, output to D7 of the latch Lh of the latches 3043. Serial bit data supplied to B4 of the register Rd of the registers 3042 is, as 8-bit parallel data, output to D3 of the latch Le of the latches 3043.

F1GS. 4 to 12 show correspondence between the inputs to the registers 3042 (Ra to Rh) and the outputs from the latches 3043 (La to Lh) with respect to bit data in a range $\alpha$ among bit data in one block shown in F1GS. 32 to 35 in cases of frame types/rates 1600 bps (2-level FM: when phase "a" has been received), 3200 bps (2-level FM: when the pair of phases "a" and "c" has been received), 3200 bps (4-level FM : when the pair of phases "a" and "c" has been received) and 6400 bps (4-level) .

In the received data buffer circuit 304, the shift clock signal "b" output from the frame speed determining circuit 302 is supplied to each of the registers 3042, while the line selection signal "a" output from the level determining circuit 301 is supplied to the received data buffer circuit 304. The data trigger "c" output from the timing control circuit 303 is supplied to each of the latches 3043.

When 2-level FM bit data has been output from the receiver circuit 2, the registers 3042 (Ra to Rh), which are input registers, fetch 64-bit data through the output "d". When 4-level FM bit data has been output from the receiver circuit 2, the registers 3042 fetch MSB (upper bits) of 64-bit data through the output "d" and LSB (lower bits) through the output "e".

Thus-fetched bit data is controlled by the line selection signal "a" output from the level determining circuit 301, the shift clock signal "b", output from the frame speed determining circuit 302 and the data trigger "c" output from the timing control circuit 303 as follows so that bit data is output as 8-bit parallel data corresponding to the respective frame types/rates.

1. In a case where the frame type is 1600 bps (2-level FM: when phase "a" has been received"):

When bit data, the frame type of which is 1600 bps (2-level FM), has been fetched, the bit data sequentially output from the receiver circuit 2 through the output "d" as W(word)0a1, W1a1, W2a1, W3a1, . . . , in a direction indicated by an arrow $\beta$ shown in FIG. 33 is, as shown in FIG. 4, fetched by B0 of the register 3042 (Ra) to B7 of the register 3042 (Rh) in the vertical directional order as W(word)0a1, W1a1, W2a1, W3a1, W5a8, W6a8 and W7a8. When the data trigger "c" has been supplied, 64 bits are, in unit of 8-bit, output to the bus line B through D0 to D7 of the latches 3043 (La to Lh).

Since 8-bit parallel data of this frame type has been received in a single phase, the process for reproducing data is completed at this time. Thus, data is, as it is, output to the buffer memory 4014 through the bus line "B". Then, the CPU 461 performs an error correction process.

Moreover, since 8 bits×8 columns, that is, 8-byte data, output from the received data buffer circuit 304 in one output operation uses only one phase, bit data in one block is converted into 8-bit parallel data for one block by performing the foregoing operation four times for each 64 bits in the case shown in FIG. 32.

2. In a case where the frame type is 3200 bps (2-level FM: when the pair of phases "a" and "c" has been received):

In the case where the frame type is 3200 bps (2-level FM), bit data in the phases "a" and "c" is multiplexed and fetched. Therefore, paralleled data is allowed to pass through the RDA of the RAM 403, and then subjected to the so-called data reproducing process in the deinterleaving circuit 5 so that the received data is separated for each phase. Then, reproduced data is, through the bus line "B", stored in the buffer memory 4014, and then subjected to the error correction process in the CPU 401.

As for a portion in the range $\alpha$ which is indicated by $\alpha 1$, bit data sequentially output from the receiver circuit 2 through the output "d" as W0a1, W0c1, W1a1, . . . , in a direction indicated by an arrow $\beta$ shown in FIG. 34 is, as shown in FIG. 5, fetched by B0 of the register 3042 (Ra) to B7 of the register 3042 (Rh) in the vertical directional order as W0a1, W0c1, W1a1, W6c4, W7a4 and W7c4. When the data trigger "c" has been supplied, 64 bits are, in unit of 8-bit, output to the bus line "B" through D0 to D7 of the latches 3043 (La to Lh).

As for a portion in the range $\alpha$ which is indicated by $\alpha 2$, bit data sequentially output from the receiver circuit 2 through the output "d" as W0a5, W0c5, W1a5, . . . , in a direction indicated by an arrow $\beta$ shown in FIG. 34 is, as shown in FIG. 6, fetched by B0 of the register 3042 (Ra) to B7 of the register 3042 (Rh) in the vertical directional order as W0a5, W0c5, W1a5, . . . , W6c8, W7a8 and W7c8. When the data trigger "c" has been supplied, 64 bits are, in unit of 8-bit, output to the bus line "B" through D0 to D7 of the latches 3043 (La to Lh).

3. In a case where the frame type is 3200 bps (4-level FM: when the pair of phases "a" and "c" has been received):

In the case where the frame type is 3200 bps (4-level FM), bit data in the phases "a" and "c" is multiplexed and fetched. Therefore, paralleled data is allowed to pass through the RDA of the RAM 403, and then subjected to the so-called data reproducing process in the deinterleaving circuit 5 so that received data is separated for each phase. Then, reproduced data is, through the bus line "B", stored in the buffer memory 4014, and then subjected to the error correction process in the CPU 401.

In this case, each one bit included in the phase "a" and the phase "c" is taken so that 2 bits (one symbol) are obtained. Therefore, serial bit data is supplied in such a manner that one bit data in the phase "a" and that in the phase "c", respectively are, as MSB and LSB, supplied in parallel to the received data buffer circuit 304 through the outputs d and e of the receiver circuit 2.

Therefore, data in the LSB of one symbol data is stored in the front portion from Ra to Rd of the registers 3042, while data in the MSB of the same is stored in the rear portion from Re to Rh.

As for a portion in the range $\alpha$ which is indicated by $\alpha 1$, bit data in the MSB sequentially output from the receiver circuit 2 through the output "d" as W0a1, W1a1, W2a1, . . . , in a direction indicated by an arrow $\beta$ shown in FIG. 34 is, as shown in FIG. 7, fetched by B0 of the register 3042 (Re) to B7 of the register 3042 (Rh) in the vertical directional order as W0a1, W1a1, W2a1, . . . , W5a4, W6a4 and W7a4. When the data trigger "c" has been supplied, 32 bits are, in unit of 4-bit, output to the bus line "B" through D4 to D7 of the latches 3043 (La to Lh).

Simultaneously, bit data in the LSB sequentially output from the receiver circuit 2 through the output "e" as W0c1, W1c1, W2c1, . . . , in a direction indicated by an arrow β shown in FIG. 34 is, as shown in FIG. 7, fetched by B0 of the register 3042 (Ra) to B7 of the register 3042 (Rd) in the vertical directional order as W0c1, W1c1, W2c1, . . . , W5c4, W6c4 and W7c4. When the data trigger "c", has been supplied, 32 bits are, in unit of 4-bit, output to the bus line "B" through D0 to D3 of the latches 3043 (La to Lh).

As for a portion in the range α which is indicated by α2, bit data in the MSB sequentially output from the receiver circuit 2 through the output "d" as W0a5, W0c5, W1a5, . . . , in a direction indicated by an arrow β shown in FIG. 34 is, as shown in FIG. 8, fetched by B0 of the register 3042 (Re) to B7 of the register 3042 (Rh) in the vertical directional order as W0a5, W1a5, W2a5, . . . , W5a8, W6a8 and W7a8. When the data trigger "c" has been supplied, 32 bits are, in unit of 4-bit, output to the bus line "B" through D4 to D7 of the latches 3043 (La to Lh).

Simultaneously, bit data in the LSB sequentially output from the receiver circuit 2 through the output "e" as W0c5, W1c5, W2c5, . . . , in a direction indicated by an arrow β shown in FIG. 34 is , as shown in FIG. 8, fetched by B0 of the register 3042 (Ra) to B7 of the register 3042 (Rd) in the vertical directional order as W0c5, W1c5, W2c5, . . . , W5c8, W6c8 and W7c8. When the data trigger "c" has been supplied, 32 bits are, in unit of 4-bit, output to the bus line "B" through D0 to D3 of the latches 3043 (La to Lh).

Since data of 8 bits×8 columns, that is, 8-byte data, which is output from the received data buffer circuit 304 in one output operation uses the phases "a" and "c", bit data for one block is converted into 8-bit parallel data for one block by performing the foregoing operations by eight times for each 64-bit data as shown in FIG. 34.

4. In a case where the frame type is 6400 bps (4-level FM):

In the case where the frame type is 6400 bps (4-level FM), all of the phase "a", phase "b", phase "c" and phase "d" are multiplexed and fetched. Therefore, paralleled data is allowed to pass through the RDA of the RAM 403, and then subjected to the so-called data reproducing process in the deinterleaving circuit 5 so that received data is separated for each phase. Then, reproduced data is, through the bus line "B", stored in the buffer memory 4014, and then subjected to the error correction process in the CPU 401.

In the case of 6400 bps (4-level FM), each one bit included in the phase "a" and the phase "b" is taken so that 2 bits (one symbol) are obtained. Moreover, each one bit included in the phase "c" and the phase "d" is taken so that 2 bits (one symbol) are obtained. Therefore, serial bit data is supplied in such a manner that one bit data in the phase "a" and that in the phase "c", are, MSB, and that in the phase "b" and that in the phase "d" are, as LSB, supplied through the outputs "d" and "e" of the receiver circuit 2.

Therefore, data in the LSB of one symbol data is stored in the front portion from Ra to Rd of the registers 3042, while data in the MSB of the same is stored in the rear portion from Re to Rh.

As for a portion in the range α which is indicated by α1, bit data in the MSB sequentially output from the receiver circuit 2 through the output "d" as W0a1, W0c1, W1a1, . . . , in a direction indicated by an arrow β shown in FIG. 35, is, as shown in FIG. 9, fetched by B0 of the register 3042 (Re) to B7 of the register 3042 (Rh) in the vertical directional order as W0a1, W0c1, W1a1, . . . , W6c2, W7a2 and W7c2. When the data trigger "a" has been supplied, 32 bits are, in unit of 4-bit, output to the bus line "B" through D4 to D7 of the latches 3043 (La to Lh).

Simultaneously, bit data in the LSB sequentially output from the receiver circuit 2 through the output "e" as W0b1, W0d1, W1b1, . . . , in a direction indicated by an arrow β shown in FIG. 35 is fetched by B0 of the register 3042 (Ra) to B7 of the register 3042 (Rd) in the vertical directional order as W0b1, W0d1, W1b1, W6d2, W7b2 and W7d2. When the data trigger "c" has been supplied, 32 bits are, in unit of 4-bit, output to the bus line "B" through D0 to D3 of the latches 3043 (La to Lh).

As for a portion in the range α which is indicated by α 2, bit data in the MSB sequentially output from the receiver circuit 2 through the output "d" as W0a3, W0c3, W1a3, . . . , in a direction indicated by an arrow β shown in FIG. 35, is, as shown in FIG. 10, fetched by B0 of the register 3042 (Re) to B7 of the register 3042 (Rh) in the vertical directional order as W0a3, W0c3, W1a3, . . . , W6c4, W7a4 and W7c4. When the data trigger "c" has been supplied, 32 bits are, in unit of 4-bit, output to the bus line "B" through D4 to D7 of the latches 3043 (La to Lh).

Simultaneously, bit data in the LSB sequentially output from the receiver circuit 2 through the output "e" as W0b3, W0d3, W1b3, . . . , in a direction indicated by an arrow β shown in FIG. 35 is fetched by B0 of the register 3042 (Ra) to B7 of the register 3042 (Rd) in the vertical directional order as W0b3, W0d3, W1b3, W6d4, W7b4 and W7d4. When the data trigger "c" has been supplied, 32 bits are, in unit of 4-bit, output to the bus line "B" through D0 to D3 of the latches 3043 (La to Lh).

As for a portion in the range α which is indicated by α 3, bit data in the MSB sequentially output from the receiver circuit 2 through the output "d" as W0a5, W0c5, W1a5, . . . , in a direction indicated by an arrow β shown in FIG. 35, is, as shown in FIG. 11, fetched by B0 of the register 3042 (Re) to B7 of the register 3042 (Rh) in the vertical directional order as W0a5, W0c5, W1a5, . . . , W6c6, W7a6 and W7ct. When the data trigger "c" has been supplied, 32 bits are, in unit of 4-bit, output to the bus line "B" through D4 to D7 of the latches 3043 (La to Lh).

Simultaneously, bit data in the LSB sequentially output from the receiver circuit 2 through the output "e" as W0b5, W0d5, W1b5, . . . , in a direction indicated by an arrow β shown in FIG. 35 is fetched by B0 of the register 3042 (Ra) to B7 of the register 3042 (Rd) in the vertical directional order as W0b5, W0d5, W1b5, W6d6, W7b6 and W7d6. When the data trigger "c" has been supplied, 32 bits are, in unit of 4-bit, output to the bus line "B" through D0 to D3 of the latches 3043 (La to Lh).

As for a portion in the range α which is indicated by α 4, bit data in the MSB sequentially output from the receiver circuit 2 through the output "d" as W0a7, W0c7, W1a7, . . . , in a direction indicated by an arrow β shown in FIG. 35, is, as shown in FIG. 12, fetched by B0 of the register 3042 (Re) to B7 of the register 3042 (Rh) in the vertical directional order as W0a5, W0c5, W1a5, . . . , W6c6, W7a6 and W7c6. When the data trigger "c" has been supplied, 32 bits are, in unit of 4-bit, output to the bus line "B" through D4 to D7 of the latches 3043 (La to Lh).

Simultaneously, bit data in the LSB sequentially output from the receiver circuit 2 through the output "e" as W0b7, W0d7, W1b7, . . . , in a direction indicated by an arrow β shown in FIG. 35 is fetched by B0 of the register 3042 (Ra) to B7 of the register 3042 (Rd) in the vertical directional order as W0b7, W0d7, W1b7, W6d8, W7b8 and W7d8. When the data trigger "c" has been supplied, 32 bits are, in unit of 4-bit, output to the bus line "B" through D0 to D3 of the latches 3043 (La to Lh).

Since data of 8 bits×8 columns, that is, 8-byte data, which is output from the received data buffer circuit 304 in one output operation uses all of the phases "a", "b", "c" and "d", bit data for one block is converted into 8-bit parallel data for one block by performing the foregoing operation by 16 times for each 64 bits as shown in FIG. 32.

The deinterleaving circuit 5 will now be described. The deinterleaving circuit 5 is separately provided from the decoder section 3 and controlled by the CPU 401 to reproduce the received interleaved block structure D2 in accordance with the received frame type so as to output the reproduced interleaved block structure D2 to the buffer memory 4014.

FIG. 14 is a block diagram showing an example of the structure of the deinterleaving circuit 5. The deinterleaving circuit 5 shown in FIG. 14 comprises shift registers 501A, 501B, 501C and 501D, rearranging circuits 502, 503 and 504 and a selector circuit 505.

Each of the shift registers 501A, 501B, 501C and 501D has a memory, the capacity of which is 8 bits, and receives data from the selector circuit 505 in unit of 8-bit. The shift registers 501A and 501B have output terminals connected to addresses 0 and 1 of the rearranging circuit 502 and to addresses 4 and 5 of the rearranging circuit 504. The shift registers 501C and 501D have output terminals connected to addresses 2 and 3 of the rearranging circuit 503 and to addresses 6 and 7 of the rearranging circuit 504.

The selector circuit 505 has an output terminal connected to the shift registers 501A, 501B, 501C and 501D and arranged to determine a rearranging circuit by selecting the address, to which data is input, the selection being performed under control of the CPU 401. The selector circuit 505 output data supplied from the RDA to each shift register corresponding to the output of the rearranging circuit.

The rearranging circuit 502 treats data, the frame type of which is 3200 bps (2-level FM), such that it fetches 1-byte data from each of the shift registers 501A and 501B to rearrange 2-byte data. Then, the rearranging circuit 502 sequentially output, to the bus line "B", reproduced data in unit of 1-byte, that is, in unit of 8-bit, in the total sum of 2 bytes.

The rearranging circuit 503 treats data, the frame type of which is 3200 bps (4-level FM), such that it fetches 1-byte data from each of the shift registers 501C and 501D to rearrange 2-byte data. Then, the rearranging circuit 503 sequentially output, to the bus line "B", two type data in unit of 1-byte, that is, in unit of 8-bit.

The rearranging circuit 504 treats data, the frame type of which is 6400 bps (4-level FM), such that it fetches 1-byte data from each of the shift registers 501A, 501B, 501C and 501D to rearrange 4-byte data to sequentially output 4-byte reproduced data in unit of 1-byte, that is, in unit of 8-bit, to the bus line "B".

The operation of the deinterleaving circuit 5 will now be described. FIGS. 15 to 17 are diagrams respectively showing the rearranging operations of the rearranging circuits 502, 503 and 504 provided to correspond to the frame types/rates. Referring to FIGS. 15 to 17, a portion of 8-bit data RD, stored in the shift registers 501A to 501D so as to be rearranged and output, which corresponds to four bits including D0 to D3 of the input data WR is referred to LSB, while a portion corresponding to four bits including D4 to D7 is referred to MSB.

1. In the case of 3200 bps (2-level FM):

As shown in FIG. 15, the rearranging circuit 502 is supplied with 8-bit data (D0 to D7) stored in the shift register 501A and 8-bit data (D0 to D7) stored in the shift register 501B by two supplying operations. Then, the rearranging operation is performed such that four odd-order bits (D0, D2, D4 and D6) of 8-bit data supplied to address 1 are rearranged to LSB of address 1 and four even-order bits (D1, D3, D5 and D7) are rearranged to LSB of address 0 so as to be reproduced and output to the bus line "B".

On the other hand, four odd-order bits (D0, D2, D4 and D6) of 8-bit data supplied to address 0 are rearranged to MSB of address 0 and four even-order bits (D1, D3, D5 and D7) are rearranged to MSB of address 1 so as to be reproducing and output to the bus line "B".

As described above, the rearranging circuit 502 is able to reproduce 16-bit (8 bits×2) data.

2. In the case of 3200 bps (4-level FM):

As shown in FIG. 16, the rearranging circuit 503 is supplied with 8-bit data (D0 to D7) stored in the shift register 501C and 8-bit data (D0 to D7) stored in the shift register 501D by two supplying operations. Then, the rearranging operation is performed such that MSB (D4, D5, D6 and D7) of 8-bit data supplied to address 2 are rearranged to MSB of address 2 and LSB (D0, D1, D2 and D3) are rearranged to MSB of address 3 so as to be reproduced and output to the bus line "B".

On the other hand, MSB (D4, D5, D6 and D7) of 8-bit data supplied to address 3 are rearranged to LSB of address 2 and LSB (D0, D1, D2 and D3) are rearranged to LSB of address 3 so as to be reproduced and output to the bus line "B".

3. In the case of 6400 bps (4-level FM):

Addresses 4, 5, 6 and 7 of the rearranging circuit 504 are, as shown in FIG. 17, supplied with 8-bit data (D0 to D7) respectively stored in the shift registers 501A to 501D in four supplying operations. When the rearranging operation is performed, D5 and D7 in the MSB portion are fetched from input 8-bit data in each of addresses 4, 5, 6 and 7. Then, each of 2-bit data is assigned from LSB portion of address 4 which is output to the bus line "B" so that 8-bit data at address 4 is formed.

Similarly, D4 and D6 in the MSB portion are fetched from input 8-bit data in each of addresses 4, 5, 6 and 7. Then, each of 2-bit data is assigned from LSB portion of address 5 which is output to the bus line "B" so that 8-bit data at address 5 is formed.

Similarly, D3 and D1 in the LSB portion are fetched from input 8-bit data in each of addresses 4, 5, 6 and 7. Then, each of 2-bit data is assigned from LSB portion of address 6 which is output to the bus line "B" so that 8-bit data at address 6 is formed.

Similarly, D2 and D0 in the LSB portion are fetched from input 8-bit data in each of addresses 4, 5, 6 and 7. Then, each of 2-bit data is assigned from LSB portion of address 7 which is output to the bus line "B" so that 8-bit data at address 7 is formed.

As described above, the rearranging circuit 504 is able to reproduce 6400 bps (4-level FM) 32-bit (8 bits×4) of 8-bit parallel data.

The address comparison circuit 6 will now be described. FIG. 18 is a circuit diagram showing an example of the internal structure of the address comparison circuit 6. The address comparison circuit 6 has, for example, an address register 601 for previously storing the own address data (21 bits), a comparison circuit 602 for comparing received/reproduced address data with address data which is stored in the address register 601 and a shift register 603 for outputting, to the bus line "B", an 8-bit coincidence signal "f", which is a result of the comparison performed by the comparison circuit 602.

The operation will now be described. The address field (AF)C5 of data reproduced by the deinterleaving circuit 5 has formatted address data which must be compared and collated with address data previously stored in the own pager.

When the comparison circuit 602 has, in unit of 8-bit, fetched data (data structure in the reproduced address field (AF)C5) supplied from the bus line "B" and which is a subject of comparison, the comparison circuit 602 compares the fetched data and address data supplied from the address register 601 (by using, for example, an EXOR circuit). By totaling the result of the comparison of each bit, a final result of the comparison is obtained (by using, for example, a NOR circuit). The result of the comparison is output to the shift register 603. The shift register 603 sequentially fetches the results of the comparison from the comparison circuit 602 so that the 8-bit coincidence signal "f" denoting the comparison result of the 8-byte address is output.

The overall operation of the circuit for receiving and reproducing data according to the first embodiment will now be described. F1GS. 19 to 22 are flow charts of the main operation of the pager. FIG. 23 is a flow chart of the operation of the deinterleaving circuit 5.

The main operation of the pager will now be described. F1GS. 19 to 22 are flow charts of the operations of the CPU 401 and the decoder section 3 to be performed from a moment at which the power source of the pager has been turned on to a moment of completion of an operation for receiving data for one frame wherein the operations of the CPU 401 and the decoder section 3 are linked to each other. Note that the operation of the decoder section 3 is described as step R . . . and that of the CPU 401 is described as step C . . . .

When a predetermined number of bit data has been stored in the RDA of the RAM 403, which can be reproduced by the deinterleaving circuit 5 and CPU 401 has detected the timing at which the deinterleaving circuit 5 can perform a reproducing process, the CPU 401 always output data to the deinterleaving circuit 5 through the bus line "B". The CPU 401 fetches data from the decoder section 3 to write this data to the RDA and performs an operation for correcting an error of data one preceding block stored in the buffer memory 4014 so as to read the contents.

Therefore, if address data included in the received address field (AF)C5 has been determined to be non-coincidence on the basis of the coincidence signal supplied from the address comparison circuit 6, control is performed such that the operations of the decoder section 3 and the receiver circuit 2 are interrupted.

Referring to F1GS. 19 to 22, data receiving and reproducing processes will now be described. When the CPU 401 has detected at step C1 that the electric power has been supplied by the operation of a power supply switch (not shown), the CPU 401 allows electric power to be supplied to the respective circuit sections connected to the CPU 401 and initializes the sections. At this time, also the operation of the decoder section 3 is started when the initializing operation has been performed so that control data for controlling the received data buffer circuit 304 corresponding to each frame pattern is set to the frame speed determining circuit 302 and the level determining circuit 301. Then, the decoder section 3 is brought into a standby state at the frequency band and the phase set by ID-ROM (steps R1 and R2). In this standby state, the CPU 401 starts an internal timer (not shown) to perform intermittent reception in a period from 1.875 seconds (one frame) to 10 seconds at intervals of 30 seconds for two minutes until synchronization is detected when the synchronization 1 (S1)C1 of the synchronizing signal portion D1 is received (step C3). Then, synchronization detection is performed by receiving the synchronization 1 (S1)C1 until a predetermined time has been elapsed (steps C4 and C6).

If synchronization has been detected, the operation proceeds to step C5 so that the timer is reset, and frame pattern data set by the synchronization 1 (S1)C1 is stored in the buffer memory 4011. If no synchronization is detected in two minutes and the lapse of the predetermined time has been confirmed, the pager is moving or stays in an area outside the service zone. Therefore, the operation proceeds to step C7 in which the fact that the pager exists outside the service zone is displayed on display unit 7. Moreover, an out-of-zone notification interruption signal for interrupting out-of-zone notification, which is output by the notifying portion 8 when the pager exists outside the zone, is output.

When the decoder section 3 has received the synchronization 1 (S1)C1, the decoder section 3 fetches it and causes the level determining circuit 301 to store data included in frame pattern data set by the synchronization 1 (S1)C1 and relating to the modulation method (step R3). Moreover, the decoder section 3 causes the frame speed determining circuit 302 to store data included in the frame pattern data set by the synchronization 1 (S1)C1 and relating to the frame speed (step R4). The received frame pattern data is also output to the CPU 401.

The decoder section 3 continues the intermittent reception at steps R2, R3 and R6 until the out-of-zone notification interruption signal is received by the CPU 401 at step C7. When the out-of-zone notification interruption signal has been received, the operation proceeds to step R7 in which the operation of the receiver circuit 2 is interrupted.

After step R4 has been performed, the decoder section 3 receives frame information (F1)C2 at step R5, and then output, to the CPU 401, the received cycle number, the received frame number and this timing information for obtaining the own frame from the frame information (F1) C2. The CPU 401, at step CB, recognizes the position of the own frame in accordance with the frame information 42B (F1) and timing information supplied from the decoder section 3 to interrupt operation of the receiver circuit 2 to the timing for the own frame comes. The process at step C8 is continued to the timing for the frame precedes to the own frame by one (step C9). The control of interrupting the operation of the receiver circuit 2 is performed by the decoder section 3 under control of the CPU 401 (step R8). The process at step R8 is repeatedly performed until a re-drive signal is input (step R9).

If the frame timing, which is preceding to the own frame by one, is detected at step C9, the CPU 401 re-drives the decoder section 3 at step C10. When the decoder section 3 is instructed to re-drive from the CPU 401 (step R9), it re-drives the decoder section 3 (step R10) in which the decoder section 3 waits for input of a re-drive control signal for the receiver circuit 2 from the CPU 401 (step R11). When the re-drive control signal for the receiver circuit 2 has been supplied from the CPU 401, the receiver circuit 2 is re-driven at step R12.

The CPU 401 re-drives the decoder section 3 (step C10), and then, at step C11, sets address data read from the ID-ROM of the ROM 402 to the address register of the address comparison circuit 6. At step C12, the CPU 401 determines an output timing of the final block of the frame, which is preceding to the own frame by one. When the timing of the final block has been detected, the CPU 401 outputs an operation control signal to the receiver circuit 2 (step C13).

When the receiver circuit 2 has been re-driven, the decoder section 3 establishes synchronization by the synchronization 1 (S1)C1 of the own frame received at step R13. Moreover, the decoder portion 3 causes the level determining circuit 301 to store data among frame pattern data of the own frame relating to the modulation method and that relating to the frame speed (step R16). Simultaneously, the received frame pattern data is also output to the CPU 401.

Then, the decoder section 3 fetches, decodes and outputs frame information (F1)C2 at step R14. Since the frame type data is, at step R13, also output to the CPU 401, the CPU 401 causes the buffer memory 4011 to re-store the frame type data at step C14. At step C15, whether or not the frames coincide with each other is determined in accordance with the decoded frame information (F1)C2. If non-coincidence is detected, the operation returns to step C8 in which frame timing, which is preceding to the own frame by one, is waited for. If coincidence is detected, the operation proceeds to step C16 in which the own frame is confirmed, continuous reception is controlled and the address of the rearranging circuit is determined by the deinterleaving circuit 5.

The decoder section 3 outputs frame information (F1)C2 to the CPU 401 at step R14, and then, at step R15, waits for input of an interruption signal which is generated when the frame non-coincidence is detected. If the interruption signal has been supplied, the operation returns to step R8 in which the operation of the receiver circuit 2 is interrupted. If the interruption is not supplied, the operation proceeds to step R16. At step R16, the synchronization 2 (S2)C3 is received, and then the timing control circuit 303 confirms synchronization of the reception of the interleaved block structure D2 and performs fine adjustment. At step R17, received data is rearranged by the received data buffer circuit 304 so that the rearranged data is output as 8-bit parallel data. Stated another way, the received data buffer circuit 804 is a kind of de-interleave circuit. Then, the operation proceeds to step R18 in which block information (BI)C4, address field (AF) C5 and vector field (VF)C6 set by the synchronizing signal portion D1 are input and the reception is continued.

At step C16, the CPU 401 also performs a process for supplying a selection control signal for selecting any one of the rearranging circuits 502, 503 and 504 which is to be connected to the selector circuit 505 of the deinterleaving circuit 5 in accordance with the frame type of the subject frame by determining the address to be employed (the operation proceeds to step D1 shown in FIG. 23).

After the operation at step C16 has been completed, the CPU 401 determines at step C17 whether or not the received frame type is 1600 bps (2-level FM). If the frame type is 1600 bps (2-level FM), the operation proceeds to step S38 in which the start word of the address field (AF)C5 is read from the block information (BI)C4 so as to be stored in the buffer memory 4013. Then, the operation proceeds to step C39.

If a determination has been performed at step C17 that data is output with a frame type except 1600 bps (2-level FM), the operation proceeds to step C18 in which received data is sequentially stored in the RDA of the RAM 403 until the number of bits of data is stored to permit the reproducing process to be performed and the timing of the reproducing process comes (step C19). When a determination has been performed that the number of bits of data, which permits the reproducing process can be performed, has been stored and the timing of the reproducing process has come, the operation proceeds to step C20 in which data is read from the RDA to supply data to the deinterleaving circuit 5. Thus, the deinterleaving circuit 5 starts performing the process for reproducing data (refer to step D4 shown in FIG. 23).

The operation of the deinterleaving circuit 5 shown in FIG. 23 will now be described. At step D1, the selector circuit 505 determines the address of the rearranging circuit for storing 8-bit data in accordance with the selection control signal for the rearranging circuit determined at step C16. Then, an operation for waiting for input of 8-bit parallel data starts (step D2). If input of 8-bit parallel data has been confirmed at step D3, the operation proceeds to step D4 in which the input 8-bit parallel data are sequentially stored in the shift register 501 (A to D). Then, 8-bit parallel data are output to the address of the rearranging circuits from the respective shift registers at step D5 as described with reference to F1GS. 15 to 17. Data reproduced by each of the rearranging circuits is, at step D6, again output to the bus line "B". After the reproducing process at step D6 has been completed, operations at steps C21, C25 and C35 are performed.

After the reproducing process at step D6 has been completed, the CPU 401 stores this data in the buffer memory 4014 to subject the same to the error correction process. At step C21, the start word of the address field (AF)C5 is read in accordance with the block information (BI)C4 to store it in the buffer memory 4013. Then, the operation proceeds to step C22.

At step C22, the CPU 401 stores the received data in the RDA of the RAM 403. At step C23, the CPU 401 determines whether a predetermined number of bits of data, which permits the reproducing process can be performed, has been stored and the timing of the reproducing process has come. If the storage of the predetermined number bits of data and the reproducing timing are confirmed at step C23, the received data are sequentially read from the RDA so as to be output to the deinterleaving circuit 5, at step C24. When data has been supplied to the deinterleaving circuit 5 through the bus line "B", the deinterleaving circuit 5 reproduces data, the frame type of which is that except 1600 bps (2-level FM) and are stored in the shift register 501 (A to D) at step D3.

Then, when the reproduced data is fetched from the deinterleaving circuit 5 through the bus line "B", the CPU 401 stores this data in the buffer memory 4014 to subject the same to the error correction process. Then, the CPU 401 outputs address data included in the address field (AF)C5 to the address comparison circuit 6 (step C25). At this time, the address comparison circuit 6 compares the received address data fetched through the bus line "B" at the timing of the data trigger "c" with the address data in the address register 601. Then, the coincidence signal "f" denoting the coincidence or non-coincidence is output to the CPU 401.

The CPU 401 instructs the decoder section 3 to fetch data. If the CPU 401 has detected coincidence of addresses because it has received the coincidence signal "f" from the address comparison circuit 6 at step C26, the operation proceeds to step C28. If the coincidences of addresses is not detected, the operation proceeds to step C27 in which the CPU 401 outputs an interruption signal to the decoder section 3. When the interruption signal has been supplied to the decoder section 3 from the CPU 401, the operation returns to step R8 in which the operation of the receiver circuit 2 is interrupted. If the coincidence signal "f" is not supplied, the operation proceeds to step R20. At steps R20 and R21, reception is continued until the interruption signal is received from the CPU 401.

At step C28, data of vector field (VF)C6 is read from the RDA following the address field (AF)C5 so that the start word and the number of words in the message field (MF)C7 are determined. At step C29, a process for interrupting the operation of the receiver circuit 2 until the start word of own message data appears is performed. When the interruption control starts, only own message data can be fetched in accordance with the determined start word. Since the decoder section 3 receives the interruption signal at step R21, the decoder section 3 interrupts the operation of the receiver circuit 2 at step R22 and the above-mentioned state is maintained until the re-drive signal is received.

When the CPU 401 has confirmed the timing for receiving the start word of own message data at step C30, the CPU 401 outputs the re-drive signal to the decoder section 3 at step C31 in order to re-drive the receiver circuit 2. Thus, the receiver circuit 2 receives data. At step C32, the CPU 401 sequentially stores received data in the RDA through the decoder section 3. When the decoder section 3 has received the above-mentioned re-drive signal output at step C31 (step R23), the receiver circuit 2 is re-driven (step R24).

After data storage in the RDA has been started at step C32, the CPU 401 determines at step C33 whether a predetermined number of bits of data, which permits the reproducing process can be performed, has been stored and the timing of the reproducing process has come. If the storage of the predetermined number bits of data and the reproducing timing are confirmed at steps C32 and C33, the received data (message data) are sequentially read from the RDA so as to be output to the deinterleaving circuit 5, at step C35. When the deinterleaving circuit 5 performs the data reproducing process, data in the next block is stored in the RDA. Then, the operation proceeds to step C35.

When data reproduced by the deinterleaving circuit 5 has been output to the bus line "B", idle blocks (IB)C8 is detected at step C35. When the idle blocks (IB)C8 is detected, an interruption signal is output to the decoder section 3 in order to interrupt the operation of the receiver circuit 2 to the timing for receiving the own frame. In order to control the reception notification at step C37, the CPU 401 causes) the notifying section 8 to notify the reception and reproduces and displays a message in accordance with the received own message data, and then the operation returns to step C9. Thus, the CPU 401, at step C9, waits for the timing of the frame, which precedes to the own frame by one. When the receiver circuit 2 has been re-driven at step R24, the decoder section 3 continues the reception operation until the operation is interrupted by the CPU 401 at step C36 (steps R25 and R26). When the interruption signal has been received at step R26, the operation proceeds to step R27 in which the operation of the receiver circuit 2 is interrupted. Then, the decoder section 3 completes the receiving operation.

Thus, the operations of the CPU 401 and the decoder section 3 have been described so that they are linked to each other to receive data with the frame pattern except 1600 bps (2-level FM) in accordance with a result of the determination performed at step C17. If the frame type of the received data is determined as 1600 bps (2-level FM) at step C17, the receiving operation, which is performed by the CPU 401, is shifted to step C38 in which an operation, in which the reproducing operation is not performed, is started.

At step C38, the block information (BI)C4 is fetched into the buffer memory 4014 so as to be subjected to the error correction process. Then, the start word of the address field (AF)C5 is stored. The CPU 401, at step C39, outputs address data, which is stored in the address field (AF)C5, to the address comparison circuit 6. Thus, the address comparison circuit 6 compares the received address data fetched through the bus line "B" at the timing of the supplied data trigger "c" with the address data in the address register 601. Then, the address comparison circuit 6 outputs the coincidence signal "f" to the CPU 401.

When the CPU 401 has detected the coincidence signal "f" denoting the coincidence of the addresses supplied from the address comparison circuit 6 at step C40, the CPU 401 shifts the operation to step C41. If the coincidence signal "f" is not detected, the CPU 401 shifts the operation to step C27 in which an interruption signal is output to the decoder section 3. When the decoder section 3 has received the interruption signal from the CPU 401, the operation returns to step R8 in which the operation of the receiver circuit 2 is interrupted. If the coincidence signal "f" is not detected, the operation proceeds to steps R20 and R21 in which reception is continued until the interruption signal is supplied from the CPU 401.

At step C41, data of the vector field (VF)C6 is, following the address field (AF)C5, supplied from the receiver circuit 2 so that the start word of own message data and the number of words in the message field (MF)C7 are determined. At step C42, control is performed such that the operation of the receiver circuit 2 is interrupted until the start word of own message data is detected. When the interruption control has started, only own message can be fetched in accordance with the determined start word. Since the decoder section 3 receives the interruption signal at step R21, it interrupts the operation of the receiver circuit 2 at step R22 and maintains this state until the re-drive signal is supplied.

When the CPU 401 has confirmed timing for receiving the start word of own message data at step C43, the CPU 401 outputs the re-drive signal to the decoder section 3 in order to re-drive the receiver circuit 2 (step C44). Thus, the receiver circuit 2 receives data, and the CPU 401 sequentially reads own message data in unit of 8-bit (step C45) and detects the idle blocks (IB)C8 (step C46). When the re-drive signal output at step C31 has been supplied at step R23, the decoder section 3 re-drives the receiver circuit 2 (step R24).

If the idle blocks (IB)C8 has been detected at step C45, an interruption signal is output to the decoder section 3 in order to interrupt the operation of the receiver circuit 2 to the timing for receiving a next own frame (step C36). The CPU 401, at step C37, causes the notifying section 8 to perform the notification process and reproduces and displays the message in accordance with the received message data in order to control notification of reception. Then, the CPU 401 returns the operation to step C9. As described above, the CPU 401, at step C9, waits for timing for the frame, which is preceding to the own frame by one. After the receiver circuit 2 has been re-driven at step R24, the decoder section 3 continues the receiving operation until the operation is interrupted by the CPU 401 at step C36 (steps R25 and R26). When the interruption signal has been received at step R26, the operation proceeds to step R27 in which the operation of the receiver circuit 2 is interrupted. Then, the decoder section 3 completes the receiving operation.

As described above, according to the first embodiment, when information (synchronization 1 (S1)C1) indicating the frame type has been received, the frame type of the data is determined. In accordance with the determined frame type, a suitable rearranging circuit is selected from the plural rearranging circuits. Therefore, load distribution to the hardware and software can be balanced. As a result, the size of the circuit and the load of the CPU can be reduced.

Second Embodiment

The first embodiment has the structure such that the data receiving operation is performed by the CPU 401 as follows. When a predetermined number of data bits have been stored in the RDA in the RAM 403, which can be reproduced and the timing for performing the reproducing process comes, a suitable rearranging circuit is selected from the plural rearranging circuits in the deinterleaving circuit 5 in accordance with the frame type of the received data. The addresses of the data reproduced by the selected rearranging circuit are subjected to a comparison processing. If the coincidence is detected, own data of the message field is fetched so that the reproducing process is performed.

However, according to the first embodiment, the CPU 401 controls the data transfer among the RAM 403, the deinterleaving circuit 5 and the address comparison circuit 6, complicated control of data transfer is required in addition to the main operation for reproducing data. Therefore, there sometimes arises a problem in that the data processing rate is lowered.

Accordingly, a pager according to a second embodiment is provided with a DMA (Direct Memory Access) circuit 11. Thus, when the CPU 401 performs the data receiving operation, as shown in FIG. 30, the DMA circuit 11 controls data transfer among the CPU 401, the RAM 404, the deinterleaving circuit 5 and the BCH decoder 10 for performing the error correction process. Thus, load which must be borne by the CPU 401 for transferring data is intended to be reduced.

Referring to FIGS. 24 to 32, the second embodiment of the present invention will now be described. In the second embodiment, the data structure C and the block structure D shown in FIG. 32 are employed.

FIG. 24 is a block diagram showing the structure of circuits in the pager which is the second embodiment of the data receiving apparatus according to the present invention. The same elements as those of the pager according to the first embodiment and shown in FIG. 1 are indicated by the same reference numerals and the same elements are omitted from description.

The pager according to this embodiment comprises the antenna 1, the receiver circuit 2, the decoder section 3, the control section 4, the deinterleaving circuit 5, the address comparison circuit 6, the display unit 7, the notifying section 8, the power supply circuit 9, the BCH decoder 10, the DMA circuit 11 and a key input section 12.

The control section 4 controls the overall operation of the pager in accordance with a control program stored in the ROM 402 and comprises the CPU 401, the ROM 402 and a RAM 404. The CPU 401 has the buffer memory 4011 for temporarily storing the frame pattern read from, for example, the synchronization 1 (S1)C1, the buffer memory 4012 for temporarily storing data (cycle number, frame number and number of plural output operations) read from the frame information (F1)C2, the buffer memory 4013 for storing the block information (BI)C4 and data read from the vector field (VF)C5 (the start word of the own message data and the number of words of message data in the address field (AF), the vector field (VF) and the message field (MF)) and the clock generator 4015 for generating clocks for use to adjust the timing of the receiving process and the like. The CPU 401 controls circuit sections connected to the CPU 401 by using the data contained in one frame and the clocks.

The RAM 404, as shown in FIG. 25, has a work area WA for enabling the CPU 401 to be operated, a memory area BDM (Block Data Memory) which is used to reproduce the received data and so that 11-block addresses of the received data for one frame supplied from the decoder section 3 at the time of performing the receiving operation are assigned in unit of block, and a memory area MMA for storing the received message data.

The BDM stores data for one frame, which is being received and reproduced, by assigning the address.

Data thus-stored is, under control of the DMA circuit 11, to be described later, output to the deinterleaving circuit 5. Data reproduced by the deinterleaving circuit 5 is re-stored in the same storage address, and then output so as to be subjected to an error correction process in the BCH decoder 10.

In a case where the block data includes an address field, data subjected to the error correction process in the address comparison circuit 6 is again output so as to be subjected to a comparison of the address data is then subjected to the address comparison process. If the coincidence is detected, data is re-stored in the same address. If the non-coincidence is detected, data is not stored in the DBM and deleted.

The BCH decoder 10 corrects an error in data by using a 10-bit BCH code and even-number parity bits included in data for one block reproduced by the deinterleaving circuit 5, and then output the error bit number to the CPU 401.

The DMA (Direct Memory Access) circuit 11 controls data transfer among the CPU 401, the RAM 404, the deinterleaving circuit 5, the address comparison circuit 6 and the DMA circuit 11 through the bus line "B".

The key input section 12 is composed of a main switch, cursor keys and memory keys to output signals denoting the operations of the key operations to the CPU 401.

The overall operation of the second embodiment will now be described.

FIGS. 26 to 29 are flow charts of the main operation of the pager. FIG. 30 is a timing chart of the operations in the DMA circuit 11 for reading and writing data between the BDM and the other circuits.

When the CPU 401 has detected at step C101 that the electric power has been supplied by the operation of a power supply switch (not shown), the CPU 401 allows electric power to be supplied to the respective circuit sections connected to the CPU 401 and initializes the sections. At this time, also the operation of the decoder section 3 is started when the initializing operation has been performed so that control data for controlling the received data buffer circuit 304 corresponding to each frame pattern is set to the frame speed determining circuit 302 and the level determining circuit 301. Then, the decoder section 3 is brought into a standby state at the frequency band and the phase set by ID-ROM (steps R101 and R102). In this standby state, the CPU 401 starts an internal timer (not shown) to perform intermittent reception in a period from 1.875 seconds (one frame) to 10 seconds at intervals of 30 seconds for two minutes until synchronization is detected when the synchronization 1 (S1)C1 of the synchronizing signal portion D1 is received (step C103). Then, synchronization detection is performed by receiving the synchronization 1 (S1)C1 until a predetermined time has been elapsed (steps C104 and C106).

If synchronization has been detected, the operation proceeds to step C105 in which the timer is reset, and frame pattern data set by the synchronization 1 (S1)C1 is stored in the buffer memory 4011. If no synchronization is detected in two minutes and the lapse of the predetermined time has been confirmed, the pager is moving or stays in an area outside the service zone. Therefore, the operation proceeds to step C107 in which the fact that the pager exists outside the service zone is displayed on display unit 7. Moreover, an out-of-zone notification interruption signal for interrupting out-of-zone notification, which is output by the notifying portion 8 when the pager exists outside the zone, is output.

When the decoder section 3 has received the synchronization 1 (S1)C1, the decoder section 3 fetches it and causes the level determining circuit 301 to store data included in frame pattern data set by the synchronization 1 (S1)C1 and relating to the modulation method (step R103). Moreover, the decoder section 3 causes the frame speed determining circuit 302 to store data included in the frame pattern data set by the synchronization 1 (S1)C1 and relating to the frame speed (step R104). The received frame pattern data is also output to the CPU 401.

The decoder section 3 continues the intermittent reception at steps R102, R103 and R106 until the out-of-zone notification interruption signal is received by the CPU 401 at step C107. When the out-of-zone notification interruption signal has been received, the operation proceeds to step R107 in which the operation of the receiver circuit 2 is interrupted.

After step R104 has been performed, the decoder section 3 receives frame information (F1)C2 at step R105, and then output, to the CPU 401, the received cycle number, the received frame number and this timing information for obtaining the own frame from the frame information (F1) C2. The CPU 401, at step C108, recognizes the position of the own frame in accordance with the frame information 42B (F1) and timing information supplied from the decoder section 3 to interrupt operation of the receiver circuit 2 until the timing for the own frame comes. The process at step C8 is continued to the timing for the frame which precedes to the own frame by one (step C109). The control of interrupting the operation of the receiver circuit 2 is performed by the decoder section 3 under control of the CPU 401 (step R108). The process at step R108 is repeatedly performed until a re-drive signal is input (step R109).

If the frame timing, which is preceding to the own frame by one, is detected at step C109, the CPU 401 re-drives the decoder section 3 at step C110. When the decoder section 3 is instructed to re-drive from the CPU 401 (step R109), it re-drives the decoder section 3 (step R110) in which the decoder section 3 waits for input of a re-drive control signal for the receiver circuit 2 from the CPU 401 (step R111). When the re-drive control signal for the receiver circuit 2 has been supplied from the CPU 401, the receiver circuit 2 is re-driven at step R112.

The CPU 401 re-drives the decoder section 3 (step C110), and then, at step C111, sets address data read from the ID-ROM of the ROM 402 to the address register of the address comparison circuit 6. At step C112, the CPU 401 determines an output timing of the final block of the frame, which is preceding to the own frame by one. When the timing of the final block has been detected, the CPU 401 outputs an operation control signal to the receiver circuit 2 (step C113).

When the receiver circuit 2 has been re-driven, the decoder section 3 establishes synchronization by the synchronization 1 (S1)C1 of the own frame received at step R113. Moreover, the decoder portion 3 causes the level determining circuit 301 to store data among frame pattern data of the own frame relating to the modulation method and that relating to the frame speed (step R116). Simultaneously, the received frame pattern data is also output to the CPU 401.

Then, the decoder section 3 fetches, decodes and outputs frame information (F1)C2 at step R114. Since the frame type data is, at step R113, also output to the CPU 401, the CPU 401 causes the buffer memory 4011 to re-store the frame type data at step C114. At step C115, whether or not the frames coincide with each other is determined in accordance with the decoded frame information (F1)C2. If non-coincidence is detected, the operation returns to step C108 in which frame timing, which is preceding to the own frame by one, is waited for. If coincidence is detected, the operation proceeds to step C116 in which the own frame is confirmed, continuous reception is controlled and the address of the rearranging circuit is determined by the deinterleaving circuit 5.

The decoder section 3 outputs frame information (F1)C2 to the CPU 401 at step R114, and then, at step R115, waits for input of an interruption signal which is generated when the frame non-coincidence is detected. If the interruption signal has been supplied, the operation returns to step R108 in which the operation of the receiver circuit 2 is interrupted. If the interruption is not supplied, the operation proceeds to step R116. At step R116, the synchronization 2 (S2)C3 is received, and then the timing control circuit 303 confirms synchronization of the reception of the interleaved block structure D2 and performs fine adjustment. At step R117, received data is rearranged by the received data buffer circuit 304 so that the rearranged data is output as 8-bit parallel data. Then, the operation proceeds to step R118 in which block information (BI)C4, address field (AF)C5 and vector field (VF)C6 set by the synchronizing signal portion D are input and the reception is continued.

At step C116, the CPU 401 also performs a process for supplying a selection control signal for selecting any one of the rearranging circuits 502, 503 and 504 which is to be connected to the selector circuit 505 of the deinterleaving circuit 5 in accordance with the frame type of the subject frame by determining the address to be employed.

After the operation at step C116 has been completed, the CPU 401 determines at step C117 whether or not the received frame type is 1600 bps (2-level FM). If the frame type is 1600 bps (2-level FM), the operation proceeds to step C127 in which the start word of the address field (AF)C5 is read from the block information (BI)C4 so as to be stored in the buffer memory 4013. Then, the operation proceeds to step C128.

If a determination has been performed at step C117 that data is output with a frame type except 1600 bps (2-level FM), the operation proceeds to step C118 in which the 8-bit parallel data is stored in the BDA of the RAM 404 with the addresses being assigned.

When it is determined that the number of data bits, which permits the reproducing process can be performed, has been stored, the DMA circuit 11 sequentially reads the data from the BDM and supplies the data to the deinterleaving circuit 5. Thus, the deinterleaving circuit 5 performs the data reproducing process and re-stores the reproduced data at the read address. When the data of one block is reproduced, the data of one block are read from the BDM and are supplied to the BCH decoder 10. The error-corrected data of one block are re-stored at the read addresses.

Then, the CPU 401, at step C119, on the basis of the block information (BI)C4, reads the start word of each of the address field (AF)C5 and the vector field (VF)C6 of data subjected to the error correction process. Then, the operation proceeds to step C120.

Then, the CPU 401 instructs to perform a comparison of address data stored in the BDM of the RAM 404. The DMA circuit 11 reads address data included in the reproduced address field (AF)C5 which has been stored in the BDM so as to output the same to the address comparison circuit 6. The address comparison circuit 6, at the timing of the data trigger "c", compares the address data received through the bus line "B" with the address data in the address register 601. Then, the address comparison circuit 6 outputs, to the CPU 401, a coincidence signal "f" denoting whether address data items coincide with each other.

The CPU 401 instructs the decoder section 3 to fetch data. Moreover, when the CPU 401 has detected the coincidence of addresses because it has received the coincidence signal "f" from the address comparison circuit 6 at step C120, it shifts the operation to step C121. If the address coincidence is not detected, the operation proceeds to step C123 in which an interruption signal is output to the decoder section 3. When the decoder section 3 has been supplied with the interruption signal from the CPU 401, the operation returns to step R108 in which the operation of the receiver circuit 2 is interrupted. If the coincidence signal "f" is not supplied, the operation proceeds to step R120 in which the receiving operation is continued.

At step C121, the start word and the number of words of own message data in the message field (MF)C7 are determined in accordance with vector data in the vector field (VF)C6. At step C122, data for one frame is sequentially fetched, and then storage address is assigned. Then, data is sequentially stored in the BDM of the RAM 404.

Simultaneously with the receiving operation performed by the CPU 401, data which is sequentially stored in the BDM is repeatedly written to and read from both of the deinterleaving circuit 5 and the BCH decoder 10.

At step C124, the idle blocks (IB)C8 is detected. When the idle blocks (IB)C8 has been detected, an interruption signal is output in order to interrupt the operation of the receiver circuit 2 to the timing for receiving a next own frame. The CPU 401, at step C126, performs control of the reception notification by performing processes for reproducing and displaying message in accordance with the received message data subjected to the notifying process in the notifying section 8. Then, the operation returns to step C109. As described above, the CPU 401 waits for a frame timing which precedes to the own frame by one. Note that the receiving operation of the decoder section 3 is continued (step R121) until interruption of the operation is instructed from the CPU 401 at step C125. If the interruption signal is supplied at step R121, the operation proceeds to step R122 in which the operation of the receiver circuit 2 is interrupted. Then, the decoder section 3 completes the receiving operation.

The operations of the CPU 401 and the decoder section 3 have been described in which they are linked to each other to receive data with the frame pattern except 1600 bps in accordance with a result of the determination performed at step C117. If the frame type of received data is detected as 1600 bps (2-level FM) at step C117, the receiving operation, which is performed by the CPU 401, is shifted to step C127 in which an operation, in which the reproducing operation is not performed, is started.

At step C127 block information (BI)C4 is output to the BCH decoder 10 so as to be subjected to the error correction process, and then stored in the BDM of the RAM 404. Then, the start words of each of the address field (AF)C5 and the vector field (VF)C6 are stored in the buffer memory 4013.

The CPU 401, at step C128, outputs address data, which is included in the address field (AF)C5, to the address comparison circuit 6. The address comparison circuit 6 compares the address data supplied through the bus line "B" at the timing of the data trigger "c" and the address data in the address register 601. Then, the address comparison circuit 6 outputs the coincidence signal "f" to the CPU 401.

At step C129, the CPU 401 detects the coincidence signal "f" supplied from the address comparison circuit 6. If the addresses coincide with each other, the operation proceeds to step C130. If the coincidence is not detected, the operation proceeds to step C123 in which an interruption signal is output to the decoder section 3. When the decoder section 3 has received the interruption signal from the CPU 401, the operation returns to step R108 in which the operation of the receiver circuit 2 is interrupted. If the coincidence signal "f" is not detected, the operation proceeds to step R131 in which the receiving operation is continued.

At step C130, the start word and the number of words of own message data in the message field (MF)C7 are determined in accordance with data of the vector field (VF)C6.

The CPU 401 causes the receiver circuit 2 to continue the data receiving process in which data is sequentially stored in the BDM in unit of one block. Moreover, the CPU 401 causes the DMA circuit 11 to continue the data transfer processes (step C131). Then, own message data are sequentially read, and then the idle blocks (IB)C8 is detected (step C132).

If the idle blocks (IB)C8 is detected at step C132, the CPU 401 outputs an interruption signal to the decoder section 3 in order to interrupt the operation of the receiver circuit 2 to the timing for receiving a next own frame (step C125). In order to control the reception notification at step C125, the notification process is performed by the notifying section 8 and the message is reproduced and displayed in accordance with received own message data. Then, the operation returns to step C109. As described above, the CPU 401, at step C109, waits for the frame timing, which is preceding to the own frame by one. When the interruption signal has been supplied to the decoder section 3 at step R121, the operation proceeds to step R122 in which the operation of the receiver circuit 2 is interrupted. Then, the decoder section 3 completes the receiving operation.

The operation, which is performed by the DMA circuit 11 will now be described with reference to a timing chart shown in FIG. 30. The timing chart shown in FIG. 30 shows the operation of the DMA circuit 11 for transfer data for one block (block #0) when data, the frame type of which is, for example, 6400 bps (4-level FM) has been received. Data, the frame type of which is 6400 bps (4-level FM), and which has been received by the receiver circuit 2 is decoded into parallel data by the decoder section 3 for each 8 bits. When parallel data has been output to the bus line "B", addresses are assigned and sequentially stored in the BDM formed in the RAM 404 under control of the CPU 401.

The DMA circuit 11, is turned on simultaneously with the reproducing process, sequentially makes accesses to data among 8-bit parallel data being stored in the BDM. The data of the block #0 having a predetermined number of bits which can be reproduced are sequentially read and supplied to the deinterleaving circuit 5. After the data reproducing process has been completed by the deinterleaving circuit 5, the reproduced data is again output to the BDM so as to be written to the same address.

As described above, when data, the frame type of which is 6400 bps (4-level FM), has been received, the DMA circuit 11 repeatedly outputs and receives block data between the BDM and the deinterleaving circuit 5 until reproducing process for one block is performed four times.

In order to cause the BCH decoder 10 to BCH-decode (correct an error) data written back to the BDM by the DMA circuit 11, the CPU 401 causes the DMA circuit 11 to read data again from the BDM so as to output the same to the BCH decoder 10. After the BCH decoder 10 has completed the error correction process, corrected data is again output to the BDM so as to be written to the same address.

During the error correction process which is performed by the BCH decoder 10, the DMA circuit 11 makes an access to data in a next block (block #1) which is being stored in the BDM to follow an instruction from the CPU 401 to output the same to the deinterleaving circuit 5 so as to be reproduced. In the case shown in FIG. 30, a process is being performed with which data is output to the deinterleaving circuit 5 relating to a process for reproducing data (second time and third time) in the next blocks.

In a case where the corrected block is data (block #1 or block #1 and block #2) in the address field (AF)C5, the CPU 401 reads address data in data which is written back to the BDM by the DMA circuit 11 and outputs the same to the address comparison circuit 6 so as to be compared with the address data of ID information. If the coincidence signal "f" from the address comparison circuit 6 is detected, the address data is written back to the BDM.

Simultaneously with the address comparison process which is performed by the address comparison circuit 6, the following process is repeatedly performed in the DMA circuit 11. The reproduced data (data of the block #3) is repeatedly transfered from the BDM to the BCH decoder 10 and the next data (data of the block #4) which is output from the decoder section 3 and stored in the BDM are accessed to be supplied to the deinterleaving circuit 5.

As described above, according to the second embodiment, the DMA circuit 11 for controlling data transfer among the CPU 401, the BDM of the RAM 404, the deinterleaving circuit 5, the address comparison circuit 6 and the BCH decoder 10 is provided in addition to the structure of the first embodiment so that the load which must be borne by the CPU 401 for transferring data is reduced.

FIG. 31 is a circuit diagram showing a modification of the second embodiment. As shown in FIG. 31, the structure according to this modification comprises a receiver module 14 formed of a PC card having an interface 15 and a circuit substrate for a personal computer, and a portable data terminal 17 having an interface 16 for a PC card slot or the like.

Referring to FIG. 31, the receiver module 14 has the antenna 1, the receiver circuit 2, the decoder section 3, the buffer memories 4011 to 4014, the clock generator 4015, the ROM 402, the RAM 404, the deinterleaving circuit 5, the address comparison circuit 6, the BCH decoder 10, the DMA circuit 11 and the interface 15 capable of output and receiving data in the bus line "B". The portable data terminal 17 has the CPU 401 for controlling the data receiving and reproducing processes, the display unit 7, the notifying section 8 and a CPU 13 for controlling circuits in the portable data terminal 17.

Although both of the first embodiment and the second embodiment of the present invention have the structure such that the present invention is applied to a sole pager adapted to paging system STD-43, the present invention is not limited to this system. The present invention may be applied to any one of an information communication terminal, a data communication device connected to a personal computer and the like.

For example, the present invention may be applied to any pager adapted to a data communication method in which information about regulation of the data frame speed or the modulation method can be output. In this case, even if a paging service company mixedly uses a plurality of paging systems, the pager according to the present invention may be applied.

What is claimed is:

1. A data receiving apparatus comprising:
   a receiver configured to receive information data in which data frames have been interleaved according to a plurality of interleave types;
   an interleave type detector configured to detect an interleave type of the received information data;
   a data buffer circuit configured to change an arrangement of the data frames on the information data received by said receiver;
   a de-interleave circuit configured to change an arrangement of the data frames output from said data buffer circuit; and
   a controller configured to selectively operate both of said and de-interleave circuit or only said data buffer circuit based on the interleave type detected by said interleave type detector,
   wherein the data frames included in the received information data are reproduced as one of an output of the data buffer circuit and an output of the deinterleave circuit in accordance with the interleave type detected by said interleave type detector.

2. A data receiving apparatus according to claim 1, wherein said interleave type denotes a data transmission rate and a data modulation method.

3. A data receiving apparatus according to claim 1, wherein said de-interleave circuit comprises a plurality of rearranging circuits for changing the arrangement of the data frames and a selector for selecting one of said plurality of rearranging circuits based on the interleave type detected by said interleave type detector.

4. A data receiving apparatus according to claim 3, further comprising:
   a data storage device which divides the data output from said data buffer circuit into data items of a predetermined length and for sequentially storing the divided data items;
   a data reader for reading the divided data items from said data storage device in a storing order and supplying read data items to said one of the plurality of rearranging circuits selected by said selector; and
   a storage controller for storing the data output from one of the plurality of rearranging circuits in said data storage device at addresses of the divided data items read by said data reader.

5. A data receiving apparatus according to claim 3, further comprising:
   a data storage device which stores data that is to be simultaneously processed by said one of the plurality of rearranging circuits selected by said selector;
   a detector which detects a data rearranging timing of said one of the plurality of rearranging circuits selected by said selector; and
   a storage controller for sequentially transferring the data from said data storage device to said plurality of rearranging circuits and sequentially storing the data output from said data buffer circuit to said data storage device.

6. A data receiving apparatus according to claim 1, further comprising a type of data storage device for storing data denoting the interleave type until another data denoting another interleave type is detected by said interleave type detector.

7. A data receiving apparatus according to claim 1, further comprising:
   an ID code storage device for storing an ID code for specifying paging of said data receiving apparatus;
   a detector for detecting the ID code from data; and
   an interrupting circuit for comparing a detected ID code with the ID code stored in said ID code storage device and for interrupting the operation of said de-interleave circuit when a non-coincidence is detected.

8. A data receiving apparatus according to claim 1, further comprising an interface for establishing a connection with an external device, and in which a receiving process of said data receiving apparatus is performed in accordance with a control signal supplied from said external device through said interface.

9. A data receiving apparatus according to claim 1, wherein said information data received by said receiver comprises multiplexed data frames of different phases.

10. A data receiving apparatus according to claim 1, wherein said interleave type detector detects type data denoting the interleave type, said type data being combined with the information data, said type data being present in a first portion of the data frames.

11. A data receiving apparatus according to claim 1, wherein said data buffer circuit comprises registers (3042: Ra to Rh) for sequentially storing bit data output from said receiver and latches (3043: La to Lh) for changing the arrangement of the data frames, said registers (3042: Ra to Rh) comprising N registers, each storing M bit data, forming a shift register, said latches comprising M latches, each storing N bit data, and bit data of the Nth register at an i-th (i being an integer from 1 to M) bit position being supplied to the i-th latch.

12. A data receiving apparatus according to claim 11, wherein said shift register is divided into two parts and wherein said data buffer circuit comprises a selector for selectively operating said two parts as one register or said two parts as two registers based on the interleave type detected by said interleave type detector.

13. A data receiving apparatus according to claim 12 wherein said interleave type denotes a data modulation method.

14. A data receiving apparatus according to claim 1, wherein said receiver receives information data in which data frames have been interleaved according to the plurality of interleave types, the information data including information denoting the plurality of interleave types, and said interleave type detector detects the type information included in the information data.

15. A data receiving apparatus according to claim 1, wherein said data buffer circuit changes the arrangement of the data frames on the information data received by said receiver based on the interleave type detected by said interleave type detector.

16. A data receiving apparatus according to claim 1, wherein said de-interleave circuit changes the arrangement of the data frames on the information data received by said receiver based on the interleave type detected by said interleave type detector.

17. A data receiving method comprising the steps of:

receiving information data in which data frames have been interleaved according to one of a plurality of interleave types;

detecting an interleave type of the received information data;

first, changing an arrangement of the received data frames; and second, changing the arrangement-changed receive data if the detected interleave type is a predetermined type, whereby data frames included in the received information data is reproduced as one of a result of the first changing and a result of the second changing according to the detected interleave type.

18. A data receiving method according to claim 17, wherein said predetermined type includes a plurality of types and wherein said second changing selects one of a plurality of rearranging circuits based on the detected interleave type, the plurality of rearranging circuits corresponding to the plurality of types.

19. A data receiving method according to claim 17, wherein said first changing changes the arrangement of the received data frames based on the detected interleave type.

20. A data receiving method according to claim 19, wherein said predetermined type includes a plurality of types and wherein said second changing selects one of a plurality of rearranging circuits based on the detected interleave type, the plurality of rearranging circuits corresponding to the plurality of types.

* * * * *